(12) United States Patent
Palaniappan et al.

(10) Patent No.: US 8,713,340 B2
(45) Date of Patent: Apr. 29, 2014

(54) METHOD AND APPARATUS FOR POWER MANAGEMENT CONTROL OF AN EMBEDDED MEMORY HAVING SLEEP AND SHUTDOWN FEATURES

(75) Inventors: Sathappan Palaniappan, Bangalore (IN); Priya Gururaj Kulkarni, Bangalore (IN); Jean Jacob, Kerala (IN); Ravindra Bidnur, Bangalore (IN)

(73) Assignee: LSI Corporation, San Jose, CA (US)

( * ) Notice: Subject to any disclaimer, the term of this patent is extended or adjusted under 35 U.S.C. 154(b) by 306 days.

(21) Appl. No.: 13/271,640

(22) Filed: Oct. 12, 2011

(65) Prior Publication Data

US 2013/0097445 A1 Apr. 18, 2013

(51) Int. Cl.
*G06F 1/32* (2006.01)
(52) U.S. Cl.
USPC ........... 713/323; 713/320; 713/324; 365/226; 365/227
(58) Field of Classification Search
CPC .............................. G06F 1/327; Y02B 60/1239
USPC ........... 365/226, 227; 713/300, 320, 323, 324
See application file for complete search history.

(56) References Cited

U.S. PATENT DOCUMENTS

| | | | | |
|---|---|---|---|---|
| 5,860,106 A | * | 1/1999 | Domen et al. | 713/324 |
| 7,437,579 B2 | | 10/2008 | Jeddeloh et al. | |
| 7,549,066 B2 | * | 6/2009 | Haid et al. | 713/320 |
| 2010/0100755 A1 | * | 4/2010 | Lin et al. | 713/324 |

OTHER PUBLICATIONS

Anmol Mathur et al., "Memory Power Reduction in SoC Designs Using PowerPro MG," 2009, pp. 1-6, Design and Reuse S.A.

* cited by examiner

*Primary Examiner* — Glenn A Auve
(74) *Attorney, Agent, or Firm* — Otterstedt, Ellenbogen & Kammer, LLP

(57) ABSTRACT

A power management controller controls a power mode associated with a memory device and includes a logic element operative to provide a power mode control signal. The logic element is responsive to first and second control signals, the second control signal being a delayed version of the first control signal. The first control signal is provided by a processing device, and the power mode control signal transitions (i) inactive before a chip select signal transitions active and/or (ii) active after the chip select signal transitions inactive. The chip select signal controls the memory device, and the power mode control signal controls the power mode associated with the memory device. A corresponding method, computer-readable medium, and electronic system are also disclosed. A method that selects a power control mode associated with the power management controller, which controls a power mode associated with the memory device, is also disclosed.

25 Claims, 26 Drawing Sheets

METHOD AND APPARATUS FOR POWER MANAGEMENT CONTROL OF AN EMBEDDED MEMORY HAVING SLEEP AND SHUTDOWN FEATURES

FIELD OF THE INVENTION

The present invention relates generally to electrical and electronic devices and circuits, and more particularly relates to power management of memory devices.

BACKGROUND OF THE INVENTION

In System-on-Chip (SoC) designs, the size of embedded memory is typically in the order of megabytes. On processor-based SoC designs, cache and tightly coupled memories are commonplace. The current pace of memory technology has surpassed Moore's Law concerning the density and performance of integrated circuits by greater than a factor of two. Thus, in a typical SoC design, memories command a substantial amount of silicon and/or board real estate and power. Further, the increasing demand for handheld devices, ranging from mobile phones to gaming devices, imposes a critical need for saving power.

Conventional memory technology includes power saving features, such as the so-called "light sleep, "deep sleep", and shutdown" modes, each of which can be entered in response to providing an appropriate voltage level on a corresponding input of the memory device. For example, when a light sleep (LS) input on the memory device is active, the memory device will enter a low leakage mode, in which output pins on the memory device remain static. Similarly, when a deep sleep (DS) input on the memory device is active, power to the peripheral circuits of the memory device is removed, output pins of the memory device are pulled low, and the contents of the memory device are retained in their current state. Likewise, when a shutdown (SD) input on the memory device is active, contents of the memory device are lost, and power is removed from peripheral circuits of the memory device and its core.

Given the power saving memory features, a logic circuit may be used to drive the power saving input pins (LS, DS, and SD) of the memory device. One solution involves connecting an inverted chip select signal (~CS) to the LS and DS inputs, and holding the resulting signal inactive for a few additional clock cycles, which results in less activity and power consumption. However, in comparison with the CS setup time, the LS and DS setup times (or more specifically, the LS and DS fall recovery times) are quite large. For example, setup times for a Virage® SRAM (part number V111HDPWV4096M16X36B2L8HS) on a slow_125_0.81 corner (which is a process, voltage, temperature (PVT) corner at which the worst timing delay is exhibited and thus must be considered during design) are shown in Table 1.

TABLE 1

| Memory Specification | Setup Time (nanoseconds) | Setup time with respect to CS |
|---|---|---|
| CS setup time | 0.4092 | 1x |
| LS rise setup time | 0.1188 | 0.29x |
| LS fall setup time | 0.9174 | 2.24x |
| DS rise setup time | 0.3586 | 0.88x |
| DS fall setup time | 3.9226 | 9.59x |

One solution includes holding the LS input pin low or inactive-if the LS rise setup time specification cannot be met and high or active if the LS fall setup time specification cannot be met. However, this solution eliminates the maximum benefit that we could get out of the light sleep mode. Similarly, if the DS rise setup time specification cannot be met, the DS pin may be tied low or inactive if the DS fall setup time specification cannot be met. However, this solution eliminates the maximum benefit that can be obtained from the deep sleep mode. Thus, logic internal to the memory device used to implement these feature becomes redundant, which results in wasted chip real estate. To achieve optimally power efficient designs, most if not all power saving features should be implemented. Alternatively, memory devices without the unused features should be utilized.

Another solution includes connecting an inverted CS (~CS) signal to the LS input in such a way that the currently accessed memory bank will be active while the remaining memory devices or bank(s), which are not currently being accessed, enter the light sleep mode. However, in this approach, there may be some latency and/or wait states required when memory banks are switched, such as when a currently dormant (not currently being accessed) memory bank or device is to be accessed. Naturally, if a particular system configuration requires only one memory bank, this approach is inappropriate. A similar result occurs if the processor, to which the memory devices are attached, cannot operate with wait states, such as if cache memory is implemented.

SUMMARY OF THE INVENTION

Principles of the invention, in illustrative embodiments thereof, advantageously improve power management of memory systems by using a power management method, controller, computer-readable medium, and method of selecting power modes. In this manner, aspects of the disclosed embodiments beneficially power consumption in memory systems.

In accordance with one embodiment of the invention, a power management controller configured to control a power mode associated with a memory device is provided that includes at least one logic element operative to provide a power mode control signal. The at least one logic element is responsive to a control signal and a delayed control signal, which represents the control signal following a delay. The control signal is provided by a processing device, and the power mode control signal transitions (1) inactive before a chip select signal transitions active and/or (2) active after the chip select signal transitions inactive. The chip select signal is operative to control the memory device, and the power mode control signal is operative to control the power mode associated with the memory device.

The control signal may include at least one of an address signal and a wait for interrupt (WFI) signal, and the power management controller may include at least one delay element. The at least one delay element is operative to provide the delayed control signal, and is responsive to the control signal. The at least one delay element includes a flip-flop, register, and/or latch. The power management controller may be configured to be operatively coupled between the processing device and the memory device, and the power mode associated with the memory device may include a light sleep mode, deep sleep mode, and/or shutdown mode. The at least one logic element may be operative to provide the chip select signal, and may be responsive to the control signal. The chip select signal active may be held active, and the power management controller may be operative to transition the power mode control signal active in response to the memory device not being accessed.

In accordance with another embodiment of the invention, a method of controlling a power mode associated with a memory device is provided, which includes providing, by a power management controller, a power mode control signal. The power mode control signal is based on a control signal and a delayed control signal, which represents the control signal following a delay. The control signal is provided by a processing device. The method also includes transitioning the power mode control signal, by the power management controller, (1) inactive before a chip select signal transitions active and/or (2) active after the chip select signal transitions inactive, the chip select signal being operative to control the memory device. The power mode control signal is operative to control the power mode associated with the memory device.

The control signal may include an address signal and/or wait for interrupt (WFI) signal, and the method may include delaying the control signal to provide the delayed control signal. The power mode associated with the memory device may include a light sleep mode, deep sleep mode, and/or shutdown mode. The method may also include providing the chip select signal based on the control signal.

In accordance with yet another embodiment of the invention, a computer-readable medium comprising instructions that, when executed by a processing device, cause the processing device to control a power mode associated with a memory device by performing a computer process. The computer process includes providing a power mode control signal based on a control signal and a delayed control signal. The delayed control signal represents the control signal following a delay, and is provided by a processing device. The method also includes transitioning the power mode control signal (1) inactive before a chip select signal transitions active and/or (2) active after the chip select signal transitions inactive. The chip select signal is operative to control the memory device, and the power mode control signal is operative to control the power mode associated with the memory device.

The control signal includes an address signal and/or wait for interrupt (WFI) signal, and the computer process may include delaying the control signal to provide the delayed control signal. The power mode associated with the memory device may include a light sleep mode, deep sleep mode, and/or shutdown mode. The computer process may include providing the chip select signal based on the control signal.

In accordance with still another embodiment of the invention, a method of selecting a power control mode associated with a power management controller is provided, wherein the power management controller is operative to control a power mode associated with a memory device. The method includes selecting, by a processing device, a largest memory device size that is less than or equal to a total memory size; determining, by the processing device, whether the memory device associated with the selected memory device size satisfies chip select signal timing requirements; determining, by the processing device, whether the memory device associated with the selected memory device size satisfies timing requirements associated with a plurality of power control modes in response to determining that the memory device associated with the selected memory device size satisfies the chip select signal timing requirements; calculating, by the processing device, power consumed by the memory device associated with the selected memory device size in the plurality of power control modes in response to determining that the memory device associated with the selected memory device size satisfies the timing requirements associated with the plurality of power control modes, and selecting, by the processing device, that power control mode in which the memory device associated with the selected memory device size consumes a least amount of power.

The method may also include reducing the memory device size in response to determining that the memory device associated with the selected memory device size does not satisfy the chip select signal timing requirements; determining whether a memory device associated with the reduced memory device size satisfies chip select signal timing requirements; determining whether the memory device associated with the reduced memory device size satisfies timing requirements associated with the plurality of power control modes in response to determining that the memory device associated with the reduced memory device size satisfies the chip select signal timing requirements; calculating power consumed by the memory device associated with the reduced memory device size in the plurality of power control modes in response to determining that the memory device associated with the reduced memory device size satisfies the timing requirements associated with the plurality of power control modes; and selecting, by the processing device, that power control mode in which the memory device associated with the reduced memory device size consumes a least amount of power. The method may also include determining whether the reduced memory device size is less than a threshold; calculating power consumed by the memory device associated with the reduced memory device size in the plurality of power control modes in response to determining that the memory device associated with the reduced memory device size satisfies the timing requirements associated with the plurality of power control modes; and selecting that power control mode in which the memory device associated with the reduced memory device size consumes a least amount of power.

The method may also include reducing the memory device size in response to determining that the memory device associated with the selected memory device size does not satisfy a timing requirement associated with at least one of the plurality of power control modes; determining whether the memory device associated with the reduced memory device size satisfies chip select signal timing requirements; determining whether the memory device associated with the reduced memory device size satisfies timing requirements associated with the plurality of power control modes in response to determining that the memory device associated with the reduced memory device size satisfies the chip select signal timing requirements; calculating power consumed by the memory device associated with the reduced memory device size in the plurality of power control modes in response to determining that the memory device associated with the reduced memory device size satisfies the timing requirements associated with the plurality of power control modes; and selecting that power control mode in which the memory device associated with the reduced memory device size consumes a least amount of power. The method may also include determining whether the reduced memory device size is less than a threshold calculating power consumed by the memory device associated with the reduced memory device size in the plurality of power control modes in response to determining that the memory device associated with the reduced memory device size satisfies the timing requirements associated with the plurality of power control modes; and selecting that power control mode in which the memory device associated with the reduced memory device size consumes a least amount of power.

In accordance with another embodiment of the invention an electronic system is provided, which includes a processing device, a memory device operatively coupled to the processing device, and a power management controller operatively coupled to the processing device and memory device. The power management controller is configured to control a power mode associated with the memory device, and includes at least one logic element operative to provide a power mode control signal. The at least one logic element is responsive to a control signal and a delayed control signal representing the control signal following a delay. The control signal is provided by the processing device, and the power mode control signal transitions at least one of (1) inactive before a chip select signal transitions active and (2) active after the chip select signal transitions inactive. The chip select signal is operative to control the memory device, and the power mode control signal is operative to control the power mode associated with the memory device.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
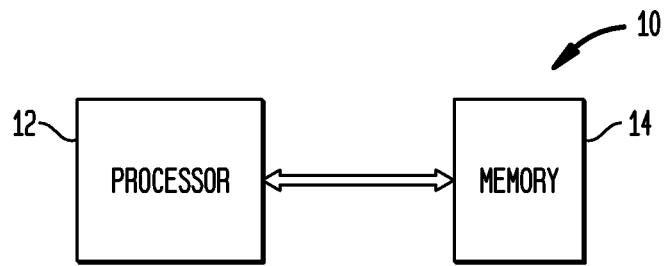
FIG. 1 is a block diagram of a system, for which the embodiments disclosed herein are intended.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF PREFERRED EMBODIMENTS

The embodiments disclosed herein, will be described in the context of illustrative power management controllers configured to enable power management features of memory devices. It should be understood, however, that the disclosed embodiments are not limited to these or any other particular circuit arrangements. Rather, the embodiments are more generally applicable to techniques for improving power management in a memory device while beneficially reducing leakage and dynamic power consumption by the memory device, among other advantages. Moreover, it will become apparent to those skilled in the art given the teachings herein that numerous modifications can be made to the embodiments described that are within the scope of the disclosure. That is, no limitations with respect to the specific embodiments described herein are intended or should be inferred.

The methods and devices disclosed herein may provide for one or more of the following features:
- memory devices that consume power only when being accessed;
- non-critical light sleep (LS) fall setup time if its delay requirement is less than n times the CS setup time, where n represents a number of pipeline stage(s) or delay element(s)+1;
- non-critical deep sleep (DS) fall setup time if its delay requirement is less than n times the CS setup time n represents a number of pipeline stage(s) or delay element(s)+1;

reduced power consumption in configurations with only a single memory device or a single bank of memory devices;

for configurations in which the processor is capable of single-, double-, and/or multi-word memory accesses and words require two or more memory devices, then during memory accesses for words from less than a complete memory bank, the non-accessed memory device(s) in the memory bank remain in a power-saving mode;

elimination of latency or wait states between memory accesses;

full realization of the benefits of the light sleep mode;

full realization of the benefits of the deep sleep mode;

efficient power management implementation that consumes a minimum of silicon and/or board real estate;

power saving input pins (LS, DS, SD) may be held inactive if the corresponding power saving features of the memory device are not implemented. During synthesis, this will get optimized automatically. For example, if inverted CS (~CS) is connected to the DS input of the memory device, connection of ~CS to the LS input becomes irrelevant since power saving in the deep sleep mode is greater than that in the light sleep mode. Hence the control pin for the irrelevant mode can be held inactive so that during optimization or synthesis the logic required to implement the irrelevant mode will be reduced or omitted; and compatibility with memory devices having different timing characteristics may be achieved by applying or readily modifying circuitry used to generate signals that drive the LS, DS, and SD inputs.

FIG. 1 is a block diagram of an exemplary system 10, including a processor 12 operatively coupled to one or more memory devices constituting memory 14. Large quantities of memory are often used in such systems 10. Unfortunately, power consumption increases drastically with larger memory requirements. Moreover, when a particular memory device is not being accessed, the resulting inactive leakage power increases, which constitutes additional wasted power. However, this wasted power can be saved. Current memory devices often provide features designed to save inactive leakage power. For example, these devices include sleep and shutdown modes that can be used to save a substantial amount of power. However, these power saving features are controlled by local hardware circuits or processors under firmware control.

Figure 2:
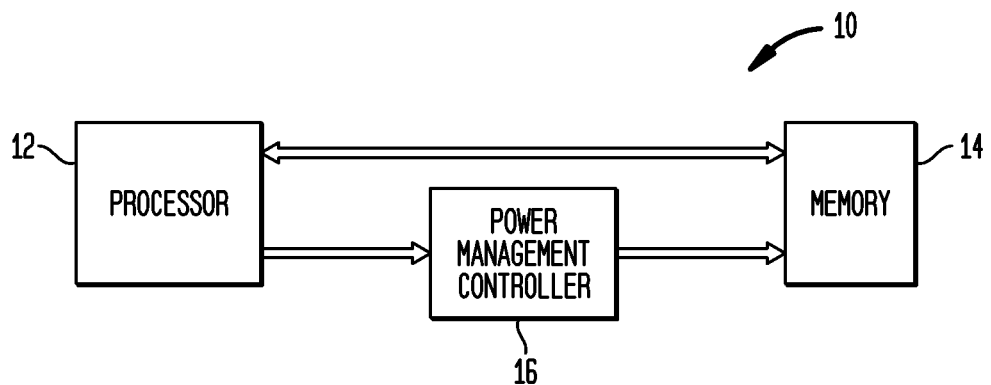
FIG. 2 is a block diagram of the system shown in FIG. 1, which incorporates a power management controller in accordance with the embodiments disclosed herein.

FIG. 2 shows the system 10 that incorporates a power management controller 16 in accordance with at least one embodiment disclosed herein. In this illustrative embodiment, the power management controller 16, which is coupled between processor 12 and memory 14, is operative to control one or more power-saving features of the memory as a function of one or more control signals received by the power management controller (e.g., from the processor).

Figure 3:
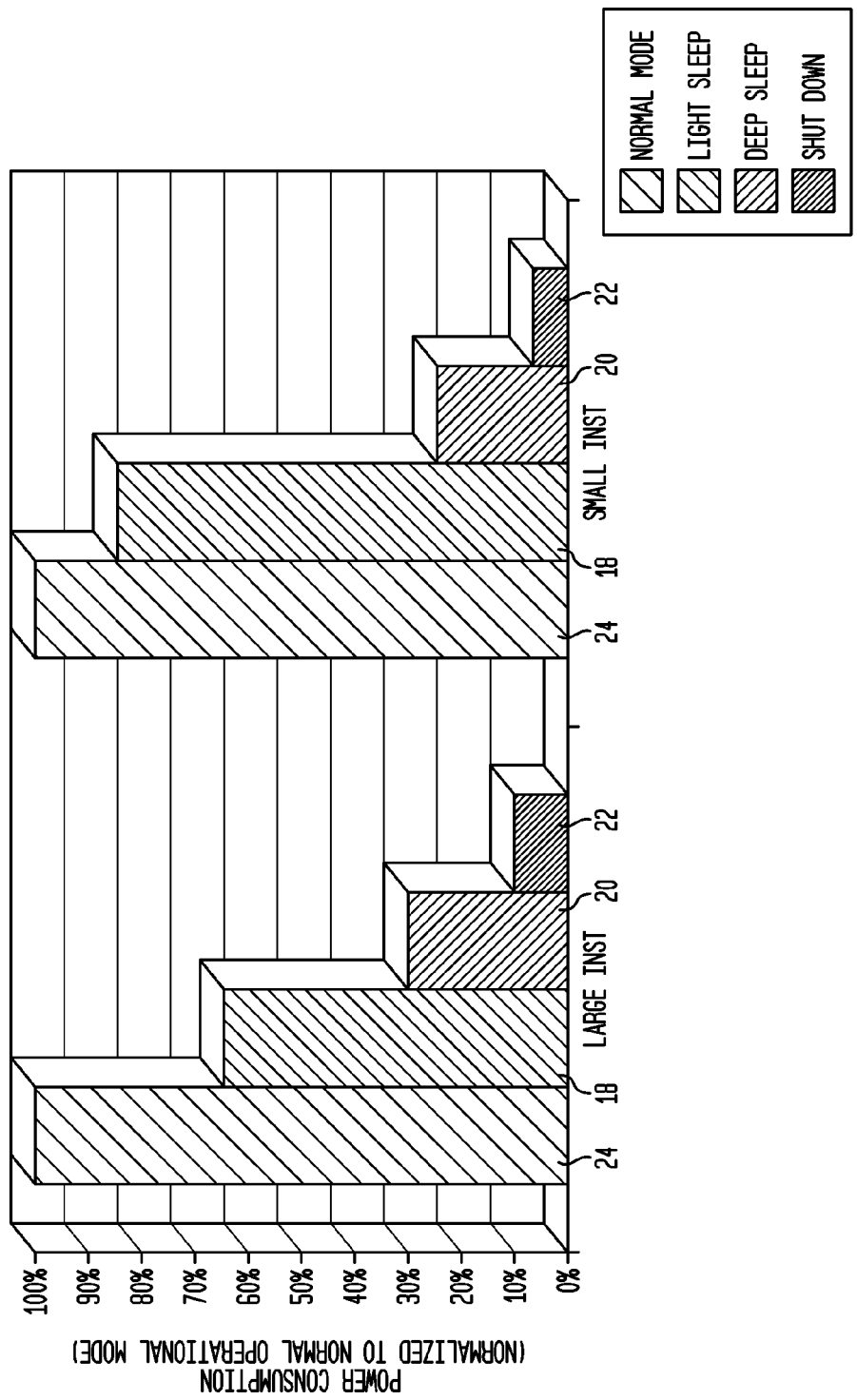
FIG. 3 is a histogram showing power consumption of a memory device in various power saving modes relative to a normal operational mode.

FIG. 3 is a histogram that shows representative power consumptions of a memory device in the light sleep mode 18, deep sleep mode 20, and shutdown mode 22, in comparison with a normal operational mode 24. Naturally, actual performance will vary depending on memory type, activity, configuration, size, as well as process, voltage, and temperature (PVT) conditions.

In a typical processor-based design, the total memory space required may be configured using physical chunks referred to as memory banks Depending on the requirements of the particular application, the number of memory banks may vary from 1 to n, where n is an integer. For example, if 192 KB of memory space is required, the total memory space may be divided into six (6) banks of 32 KB memory devices in each bank or three (3) banks of 64 KB memory device in each bank. In most cases, only one of these memory banks will be accessed by the processor at any given time.

Based on address outputs from the processor, a bank select signal is generated for each memory bank, which is referred to as the chip select (CS). The CS may be asserted, which would be a logic high or one (1) in this case, for only one bank that is currently being accessed, while the remaining (non-accessed) memory bank(s) will have an inactive CS, which would be a logic low or zero (0) in this case. Of course, the assignment of logic levels to the CS signal is essentially arbitrary. For instance, in an alternative embodiment, an active CS signal may be defined as a logic zero. Thus, except for the memory bank currently being accessed, the remaining (non-accessed) banks may be placed into the light sleep, deep sleep, or shutdown modes. Even if there is only one bank of memory devices, whenever such a bank is not being used, that memory bank may be placed into one of the power saving modes. Leakage power from the system is substantially reduced upon the memory device entering the light sleep mode, further reduced upon entering the deep sleep mode, and still further reduced upon entering the shutdown mode.

The "recovery time" is that amount of time that a memory device requires to recover from being in a power saving mode. The recovery time corresponding to the shutdown mode is significantly greater than that required to recover from the deep sleep mode, both of which are greater than that required to recover from the light sleep mode. Thus, recovery time is analyzed when selecting memory devices to ensure that a particular performance desired in an application is achievable. Local control signals directly output or derived from signals output from the processor, such as inverted chip select (~CS) or wait for interrupt (WFI), may be used for asserting LS, DS or SD. Since the LS and DS fall setup time specifications for a typical memory device are greater than the CS setup time, this parameter poses a significant constraint on memory performance.

To improve memory performance, an embodiment of the invention includes generation of an inverted look-ahead chip select (CS) signal that is used to assert the LS, DS, and/or SD mode pins. The inverted look-ahead CS input may be brought inactive at least one full clock cycle before the CS input is brought active, which makes recovery from the power saving modes less critical by providing additional recovery time equal to at least one full clock cycle before the CS input becomes active. Similarly, a look-ahead WFI output of the processor may be brought inactive one full clock cycle before the CS input is brought active, which makes recovery from the power saving modes less critical by providing additional recovery time equal to at least one full clock cycle before the CS input becomes active. The inverted look-ahead CS input may also be brought active at least one full clock cycle after the CS input is brought inactive, and the look-ahead WFI output of the processor can be brought active at least one full clock cycle after the CS input is brought active to effectively compensate for the timing requirements of the power-saving modes.

Figure 4:
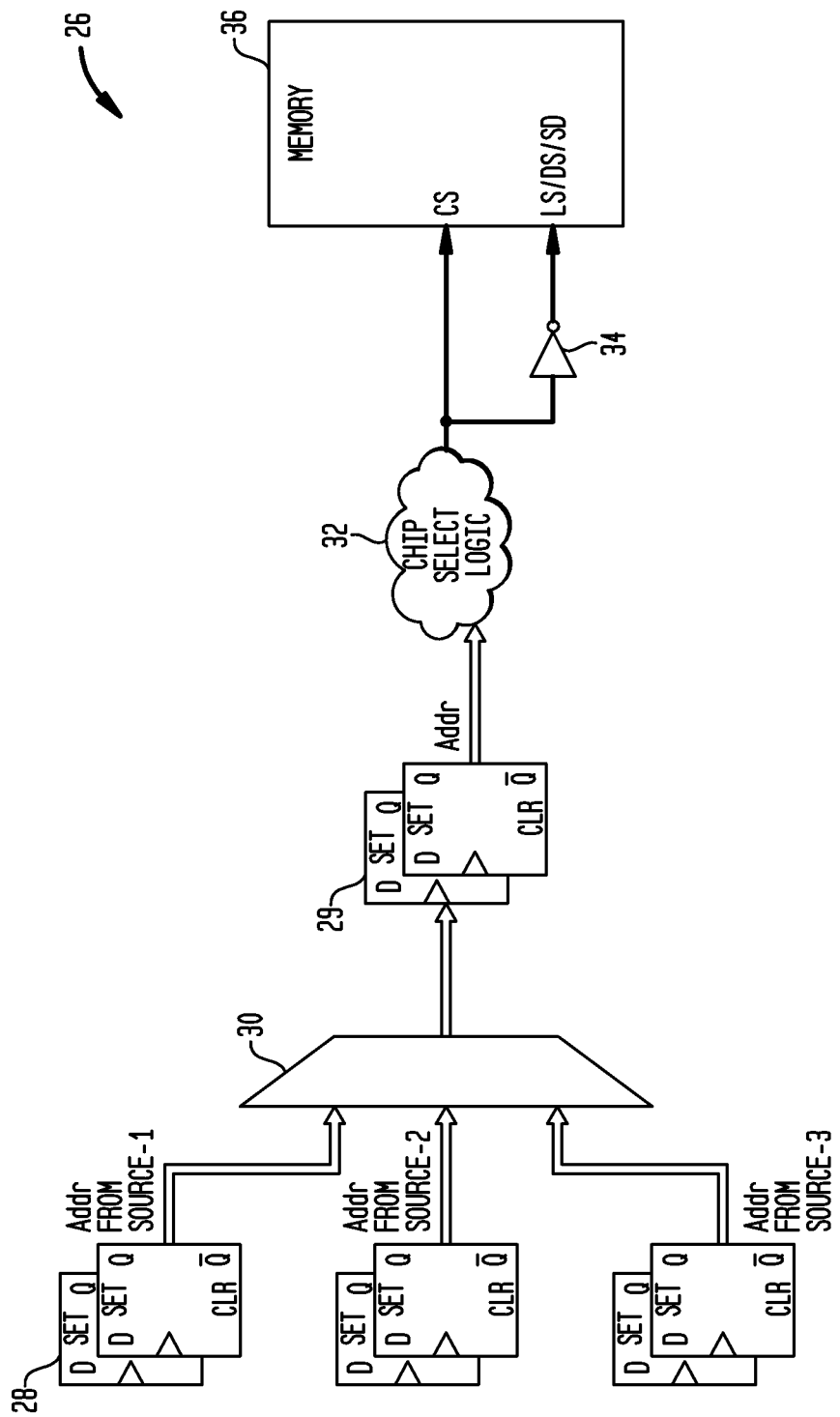
FIG. 4 is a block diagram of a circuit configured to control power saving modes of the memory device.

FIG. 4 shows an embodiment of a chip select/power save circuit 26 in a typical system, which includes address registers 28, a multiplexer 30, chip select logic 32, an inverter 34, and a memory device 36. Address outputs from two or more sources or registers 28 are selected for chip select generation by the multiplexor 30. The address outputs from the multiplexor 30 may be coupled to additional D flip-flops or registers 29, and then coupled to the chip select logic 32, which generates the CS signal that is coupled to the CS input of the memory device 36. The CS signal is also applied to the inverter 34, which provides an inverted CS signal (~CS) that is supplied to the LS, DS, and/or SD inputs of the memory device 36.

Figure 5:
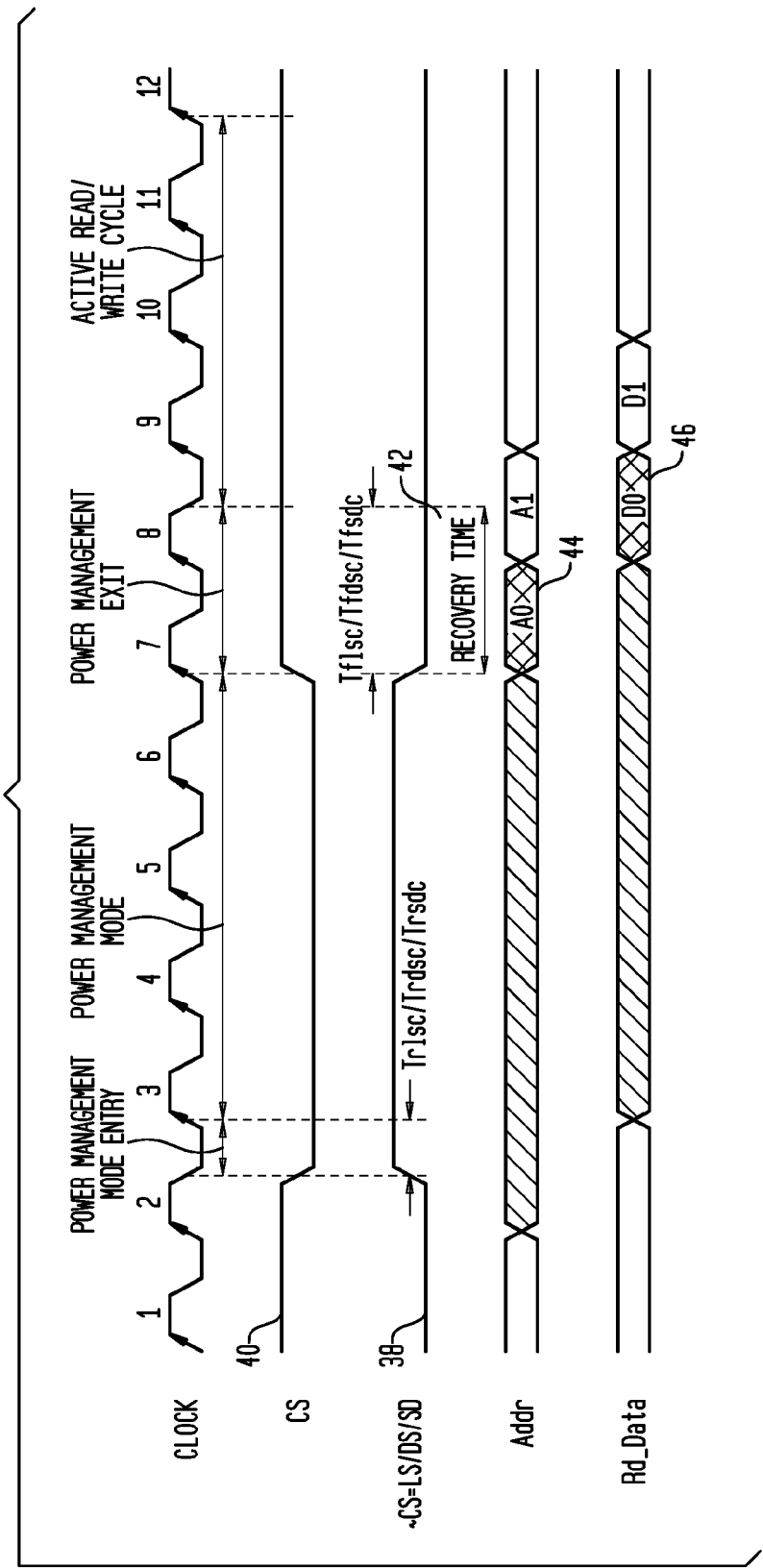
FIG. 5 is a timing diagram showing signal waveforms relevant to the circuit of FIG. 4 as a function of time.

An illustrative timing diagram for the circuit 26 shown in FIG. 4 is depicted in FIG. 5. In the timing diagrams shown herein, "Trlsc" refers to the light sleep mode pin rise time, "Trdsc" refers to the deep sleep mode pin rise time, "Trsdc" refers to the shutdown mode pin rise time, "Tflsc" refers to the light sleep mode pin fall time, "Tfdsc" refers to the deep sleep mode pin fall time, and "Tfsdc" refers to the shutdown mode pin fall time. These timing requirements specify a minimum time that the signal controlling the LS, DS, and/or SD input pins of the memory device must satisfy to ensure proper entry into and exit from the respective power saving modes. As shown in FIG. 5, since the LS/DS/SD input 38 to the memory device is brought inactive with the CS input 40 being brought active, the recovery time 42 following exit from the corresponding power saving mode causes the memory device to be non-responsive to address inputs 44 from the processor. Thus, the data outputs 46 from the memory device are also invalid during this time as indicated by cross-hatching in FIG. 5. As a result, the embodiment shown in FIG. 5 requires the processor to wait for valid data following exit from the power saving mode.

Figure 6:
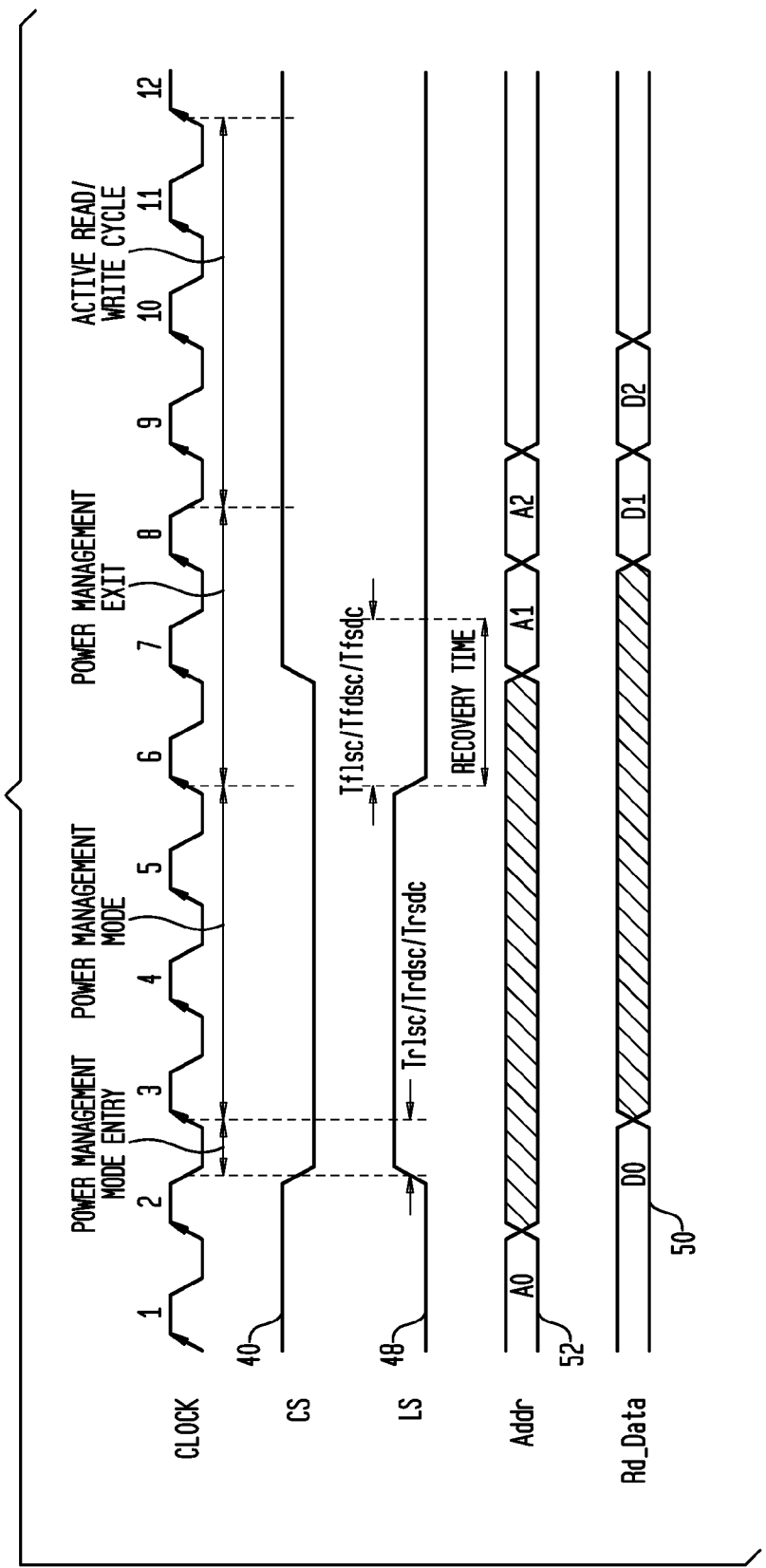
FIGS. 6-8 are timing diagrams showing signal waveforms relevant to the embodiments disclosed herein as a function of time.

FIG. 6 is an illustrative timing diagram showing an inverted look-ahead CS signal 48 that may be applied to the LS input of the memory device, according to an embodiment of the invention. The inverted look-ahead CS signal 48 is brought active upon the CS input 40 being brought inactive, and the inverted look-ahead CS signal 48 is brought inactive one clock cycle before the CS input 40 is brought active. During entry into the light sleep mode, the memory device holds the last data output D0 50 constant, and thus there is no issue concerning when the address input A0 52 is valid since the data output D0 50 is available during the next clock cycle as shown in FIG. 6. However, upon entering the deep sleep and shutdown modes, the memory data output is zero. Thus, for address A0 52, the memory data output will be zero during sleep mode entry, whereas the data D0 50 is expected. Therefore, entry into the deep sleep and shutdown modes is delayed by a clock cycle. In general, memory accesses occur in two phases; an address phase followed by a data phase.

Figure 7:
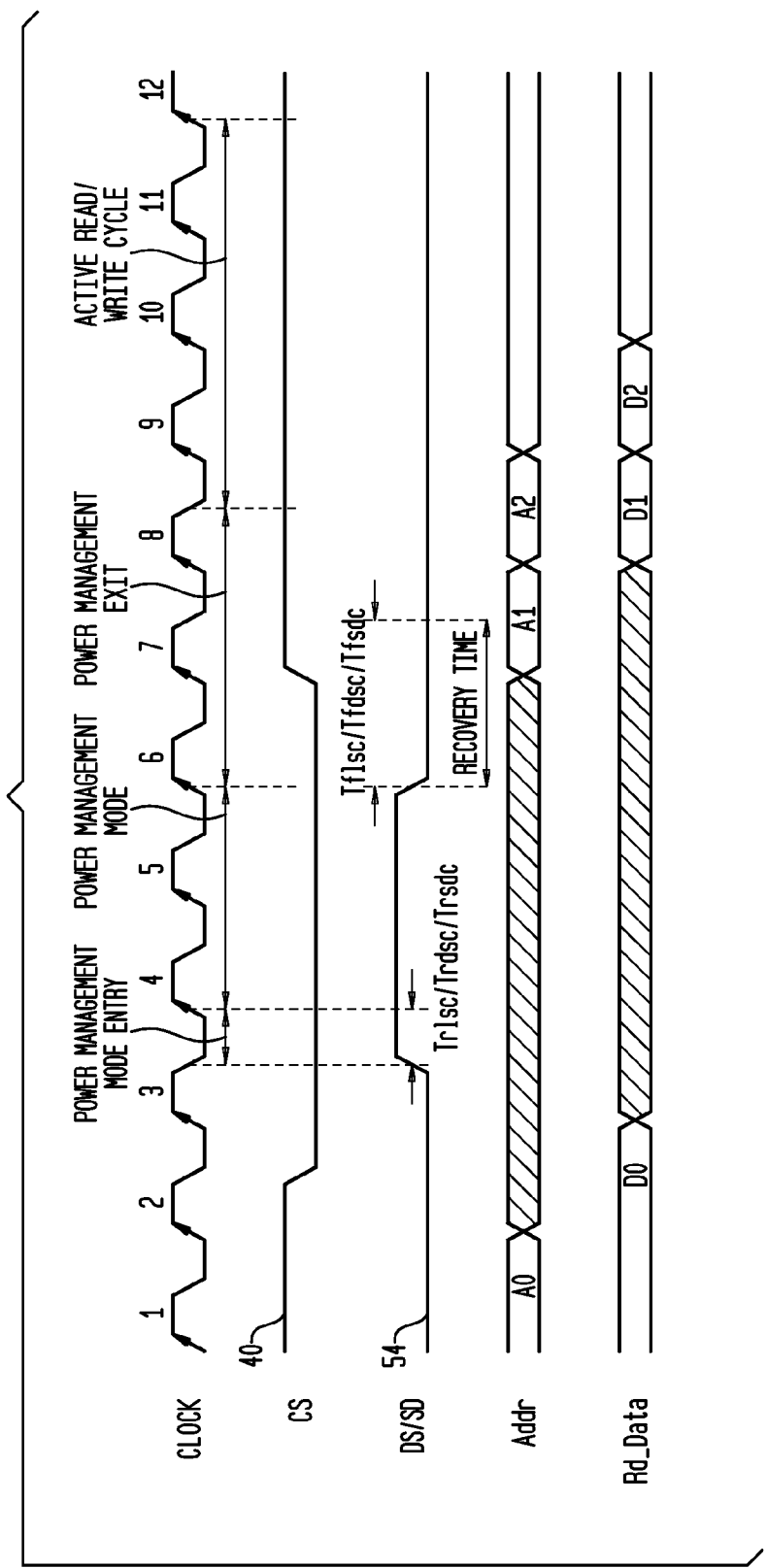

FIG. 7 shows an illustrative timing diagram of a DS/SD signal 54 that may be applied to either the DS or SD inputs of the memory device, in accordance with an embodiment of the invention. During entry into the deep sleep or shutdown modes, the memory device data output D0 is held low, and thus these modes (deep sleep and shutdown) may be entered at least one clock cycle later, so that the address A0 and data D0 will be valid later. The DS/SD signal 54 is brought active one clock cycle after the CS input 40 is brought inactive, and the DS/SD input 54 is brought inactive one clock cycle before the CS input 40 is brought active.

Figure 8:
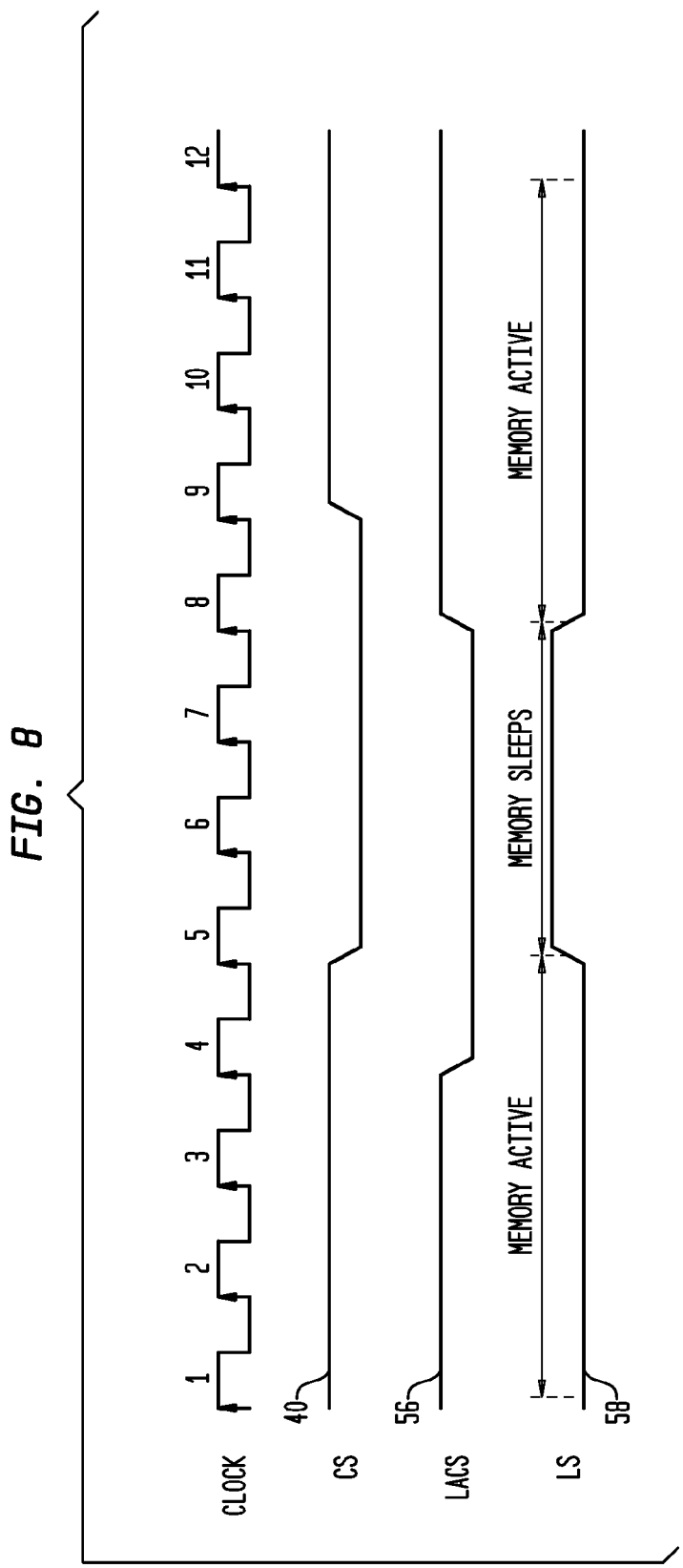

Logic design for the LS input pin of the memory device will now be discussed. FIG. 8 is an exemplary timing diagram for the chip select (CS) signal 40 and a look-ahead chip select (LACS) signal 56, which are used to generate the light sleep mode (LS) signal 58 for connection to the LS input pin of the memory device, according to an embodiment of the invention. The truth table for the light sleep (LS) mode input pin, which is based on CS and LACS, is shown in Table 2 below.

TABLE 2

| CS | LACS | LS |
|---|---|---|
| 0 | 0 | 1 |
| 0 | 1 | 0 |
| 1 | 0 | 0 |
| 1 | 1 | 0 |

Figure 9:
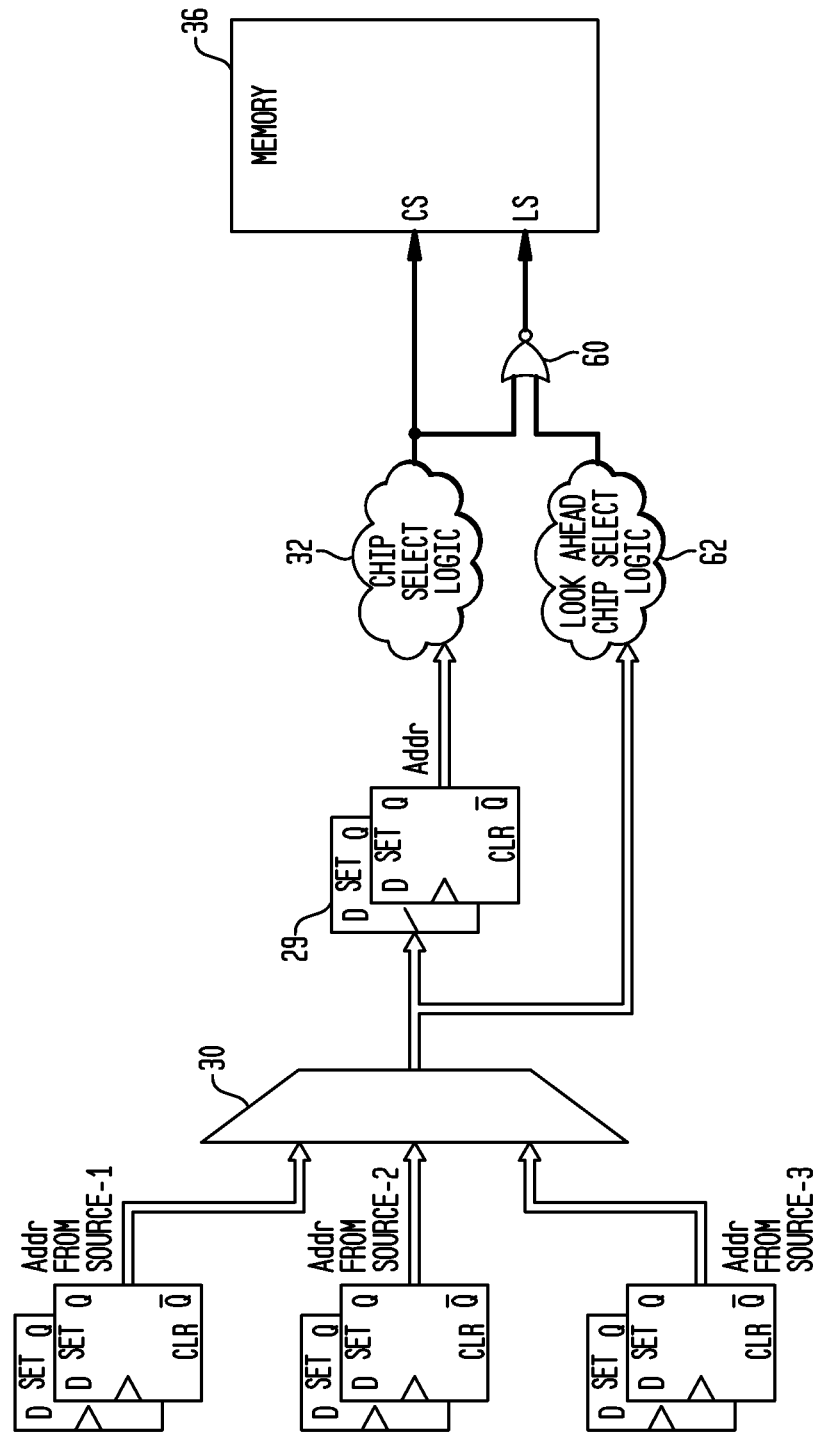
FIG. 9 is a block diagram of a first embodiment of a circuit implementing an inverted look-ahead chip select to control a light sleep mode in accordance with the embodiments disclosed herein.

Based on Table 2, the circuit shown in FIG. 4 is modified to generate a first embodiment of the inverted look-ahead CS (LACS) circuit, which is shown in FIG. 9. With reference to FIG. 9, the CS signal, supplied to the CS input of the memory device 36, is derived from a clock-delayed version of the address signals following the address registers 29 and chip select logic 32. The CS input signal is also applied to a first input of a NOR gate 60. A non-delayed version of the address signals prior to registers 29 following application of look-ahead chip select logic 62 is applied to a second input of the NOR gate 60.

Figure 10:
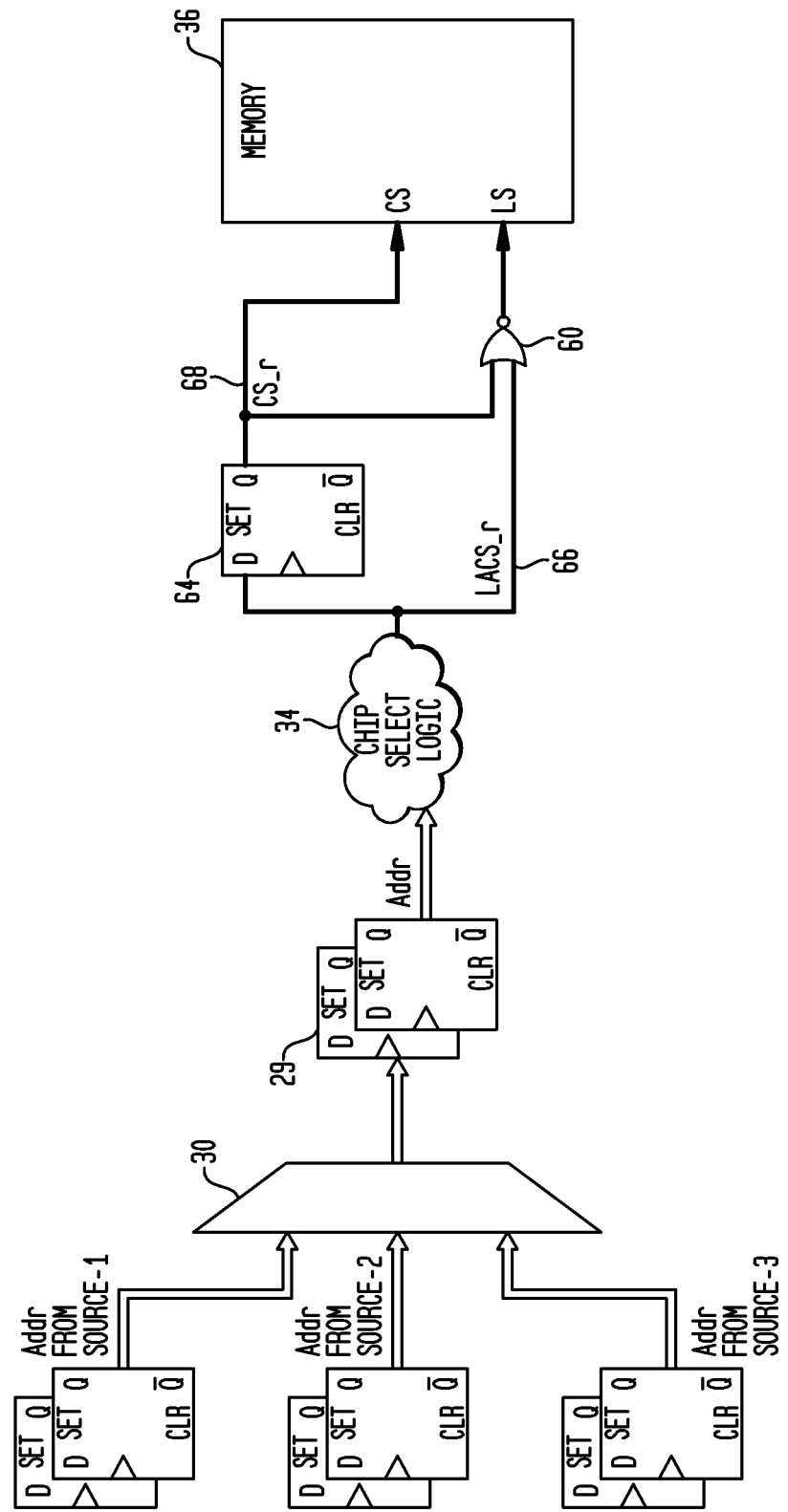
FIG. 10 is a block diagram of a second embodiment of a circuit implementing the inverted look-ahead chip select to control the light sleep mode in accordance with the embodiments disclosed herein.

Based on Table 2, the circuit shown in FIG. 4 can also be modified to generate a second embodiment of the inverted look-ahead CS (LACS) circuit shown in FIG. 10. With reference to FIG. 10, the delayed CS signal, supplied to the memory device 36, is derived from a clock-delayed version of the address signals following the address registers 29, chip select logic 34, and a register 64. The delayed CS input signal CS_r of the memory device is also applied to a first input of NOR gate 60. An earlier version of the address signals LACS_r following the registers 29 and chip select logic 34 is applied to a second input of the NOR gate 60. Specifically, an output of the chip select logic 34, namely, LACS_r 66, is coupled to a D input of flip-flop or register 64, and a Q output of the flip-flop or register 64 generates the delayed CS signal CS_r 68 which is coupled to the CS input of the memory device 36. The earlier version of the address signals LACS_r 66, output from the chip select logic 34, is also supplied, along with the output of the clocked latch 64, to separate inputs of the NOR gate 60, the output of which is coupled to the LS input of the memory device 36.

Figure 11:
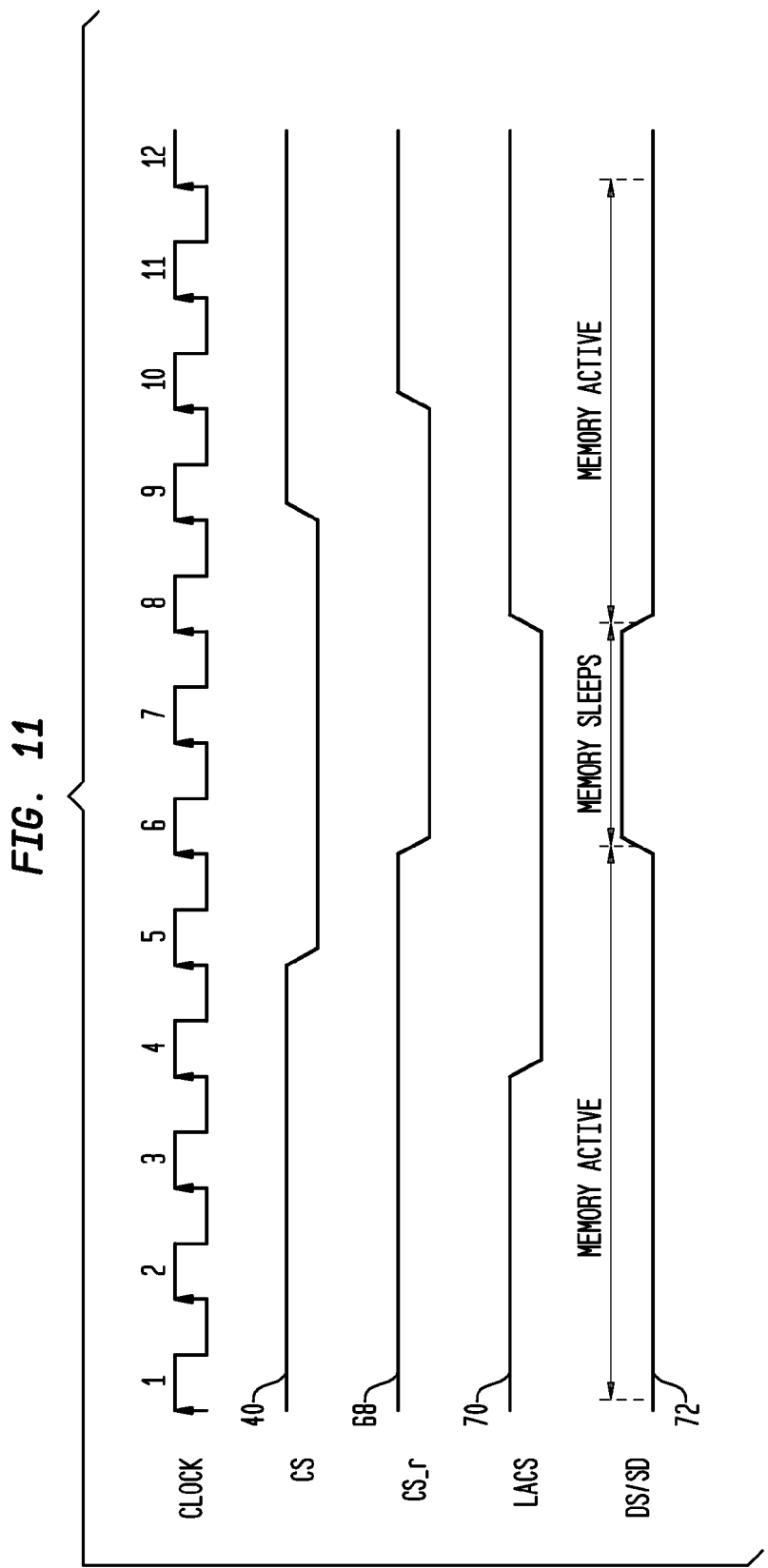
FIG. 11 is a timing diagram showing signal waveforms relevant to the circuits of FIGS. 9 and 10 as a function of time.

Logic design associated with the DS/SD pin will now be discussed. FIG. 11 shows illustrative timing for the chip select (CS) signal 40, delayed chip select (CS_r) signal 68, and look-ahead chip select (LACS) signal 70, which are used to generate a deep sleep/shutdown mode DS/SD signal 72 for connection to the DS and/or SD input pins of the memory device. Table 3 is an exemplary truth table for the deep sleep/shutdown mode pin (DS/SD) signal based on CS, CS_r, and LACS signals shown in FIG. 11.

TABLE 3

| CS | CS_r | LACS | DS/SD |
|---|---|---|---|
| 0 | 0 | 0 | 1 |
| 0 | 0 | 1 | 0 |
| 0 | 1 | 0 | 0 |
| 0 | 1 | 1 | 0 |
| 1 | 0 | 0 | 0 |
| 1 | 0 | 1 | 0 |
| 1 | 1 | 0 | 0 |
| 1 | 1 | 1 | 0 |

Figure 12:
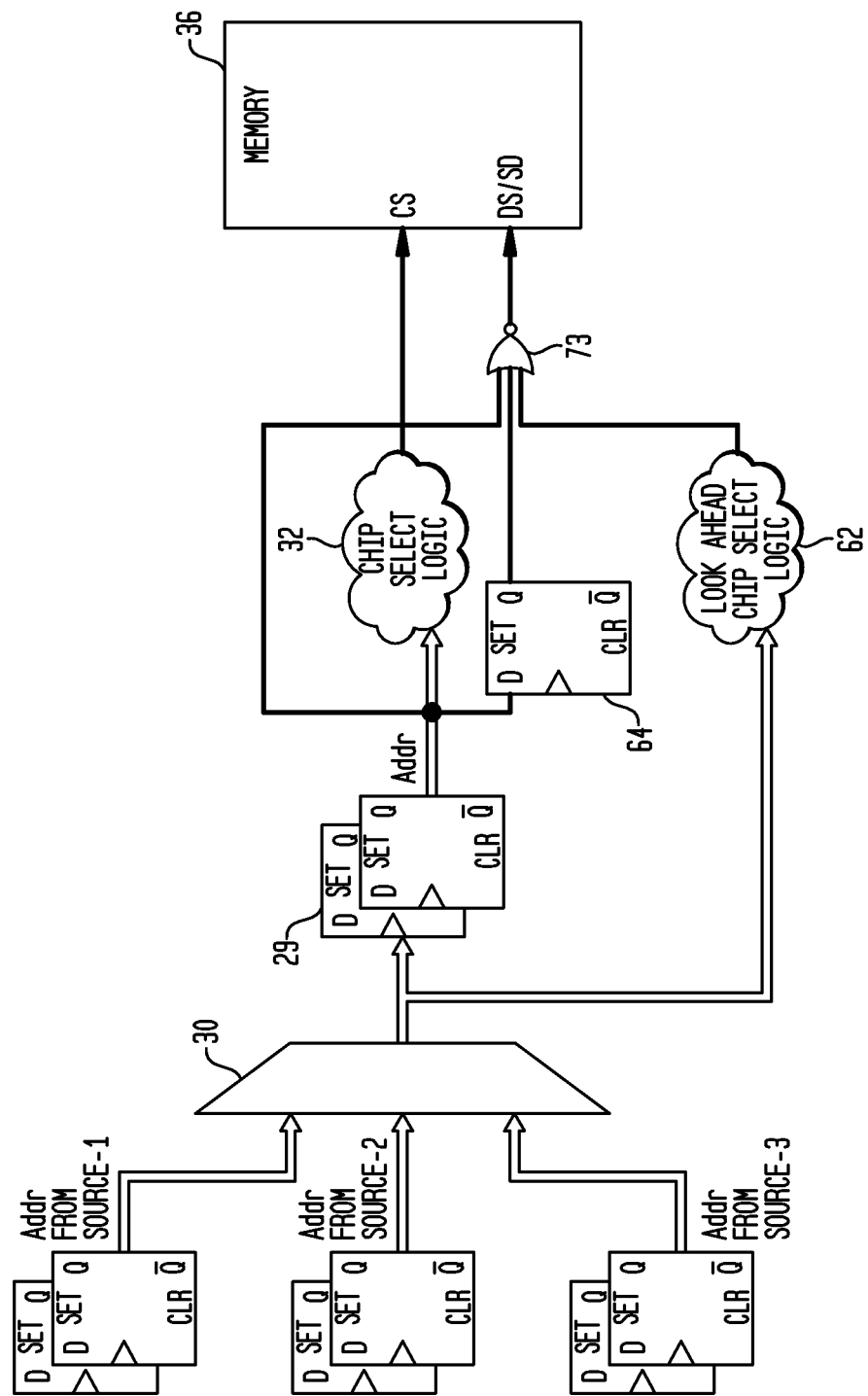
FIG. 12 is a block diagram of a first embodiment of a circuit implementing the inverted look-ahead chip select to control deep sleep and shutdown modes in accordance with the embodiments disclosed herein.

Based on Table 3, the circuit shown in FIG. 4 may be modified to generate a first embodiment of the inverted look-ahead CS (LACS) circuit shown in FIG. 12. Specifically, with reference to FIG. 12, the respective outputs of registers 29 are coupled to chip select logic 32, an output of which is coupled to the CS input of the memory device 36. At least one output of registers 29 is also coupled to a first input of a NOR gate 73 and to a D input of register 64, the Q output of which is also coupled to a second input of the NOR gate 73. The output of the multiplexor 30 is coupled to the respective D inputs of registers 29 and to the look-ahead chip select logic 62, the output of which is also coupled to a third input of the NOR gate 73. The output of the NOR gate 73 may be coupled to the DS and/or SD inputs of the memory device depending on the choice of memory device and memory power management architecture.

Figure 13:
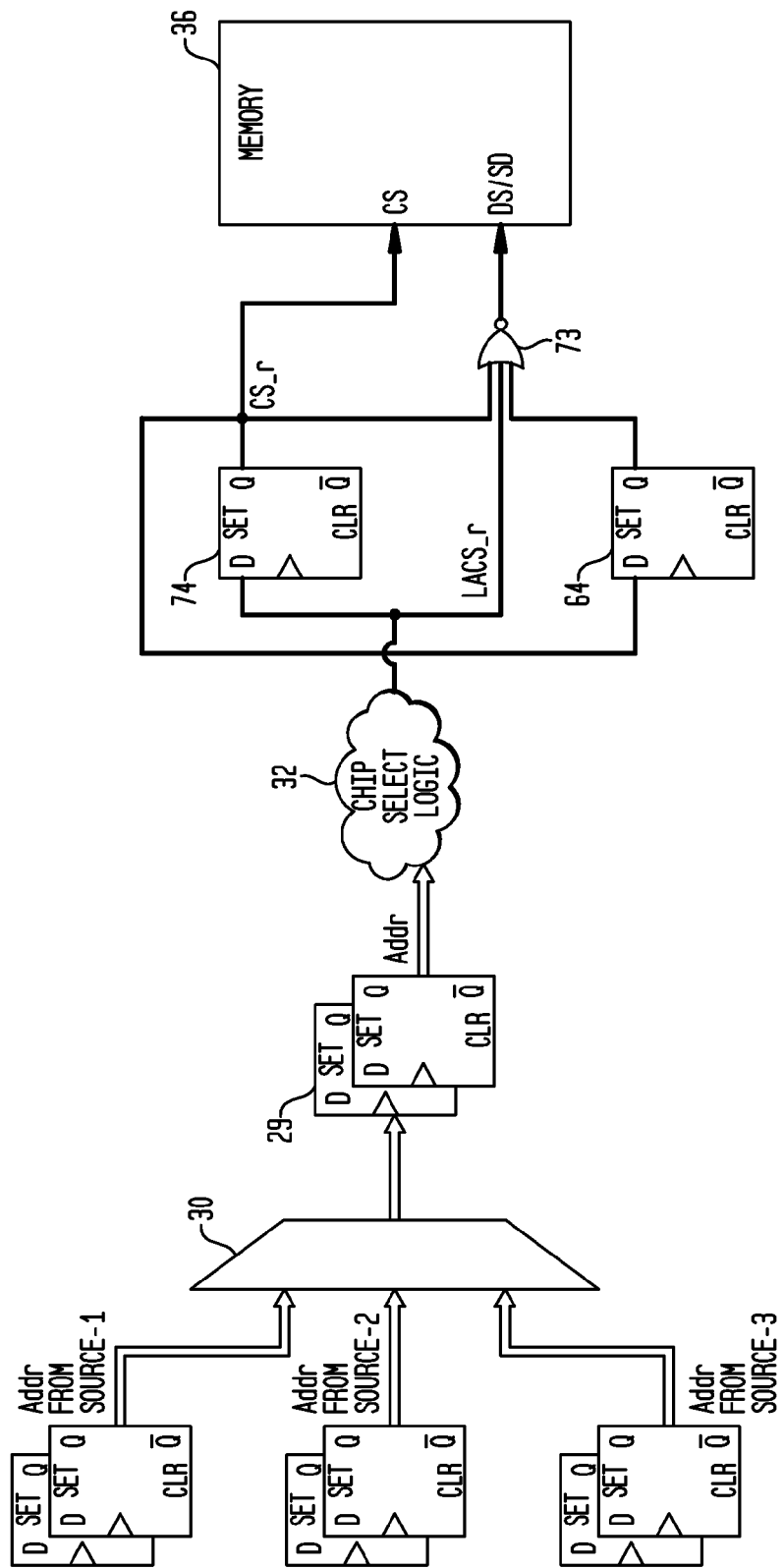
FIG. 13 is a block diagram of a second embodiment of a circuit implementing the inverted look-ahead chip select to control deep sleep and shutdown modes in accordance with the embodiments disclosed herein.

Based on Table 3, the circuit shown in FIG. 4 may be modified to generate a second embodiment of the inverted look-ahead CS (LACS) circuit shown in FIG. 13. Specifically, the respective outputs of registers 29 are coupled to chip select logic 32, the output of which is coupled to the D input of register 74 and to the first input of NOR gate 73. The Q output of register 74 is coupled to the CS input of memory device 36, the D input of latch 64, and the second input of NOR gate 73. The Q output of register 64 is coupled to the third input of the NOR gate 73, the output of which may be coupled to the DS and/or SD inputs of the memory device 36 depending on the choice of memory device and memory power management architecture.

In another embodiment, a multimode implementation of a power management controller that controls the power saving inputs of a memory device is provided, which includes the following modes:

Mode 1—in which the WFI output of the processor is coupled to the DS input of the memory device, and the inverted look-ahead CS circuit shown in FIG. 9 is coupled to the LS input of the memory device;

Mode 2—in which the inverted look-ahead CS circuit shown in FIG. 12 is coupled to the DS input of the memory device;

Mode 3—in which the inverted look-ahead CS circuit shown in FIG. 9 is coupled to the LS input of the memory device;

Mode 4—in which the WFI output of the processor is coupled to the DS input pin of the memory device. It is to be noted that the same or similar methods of looking-ahead applied to the chip select signal (which provides an offset between the chip select signal and signals used to control the power saving modes of a memory device) can as well be applied to other signals, such as WFI, used in the generation of control signals for the power saving modes (LS, DS, and SD) while remaining within the scope of the present disclosure; and Mode 5—in which the WFI output of the processor is coupled to the LS input pin of the memory device.

Regarding mode 1, if the DS recovery time is greater than or equal to the system clock period (reciprocal of the system clock frequency), then connecting the inverted look-ahead CS signal to DS input of the memory device is ineffective. However, it is to be noted that the inverted look-ahead signals, such as CS, disclosed herein may also be derived from an even earlier version of the address, or other signal, before clocking by one or more registers has occurred. Such an earlier version may be readily available due to deep pipelined stages of address decoding internal and/or external to the processor.

The WFI output is asserted by the processor when the processor is waiting for an interrupt. In general, when the processor is no longer waiting for an interrupt, such as during or following an interrupt service routine, there will be a delay before the processor is able to resume accessing memory, which typically lasts for a few clock cycles. Thus, the WFI output of the processor may be connected to the DS input of the memory device, and the inverted look-ahead CS may be connected to the LS input pin of the memory device. As a result, if the processor is waiting for an interrupt (i.e., WFI is active), the memory device will be in the deep sleep state, and if the processor is idle or not accessing at least a portion of the memory devices, those memory devices not being accessed will be in the light sleep mode.

Figure 14:
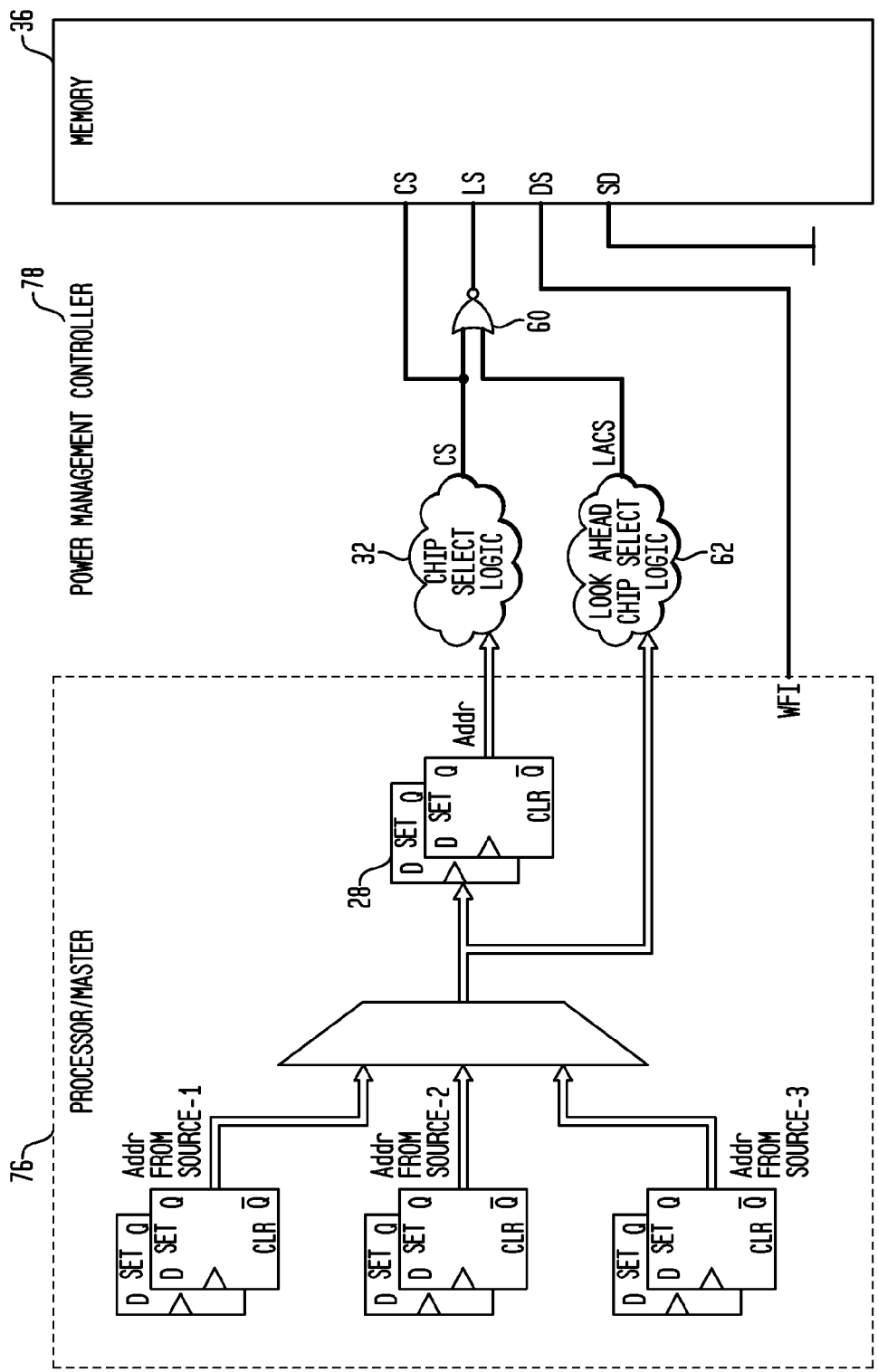
FIG. 14 is a block diagram of a circuit implementing mode 1 in accordance with the embodiments disclosed herein.

FIG. 14 shows a block diagram of an illustrative circuit implementation of mode 1, which includes a processor 76, a power management controller 78, and memory device 36, according to an embodiment of the invention. The WFI output of the processor 76 is coupled to the DS input of the memory device 36, and the inverted look-ahead CS signal shown in FIG. 9 is coupled to the LS input of the memory device 36. The SD input of the memory device is held inactive by, for example, connecting it to ground. The processor 76 may provide address signals that have been clocked through various numbers of register 28 stages for LS input generation. For example, the address signals used to generate the look-ahead chip select signal (LACS) are derived from address signals at least one clock cycle earlier than address signals used to generate the chip select signal (CS). Such register stages may be implemented internally or externally to the processor 76.

Figure 15:
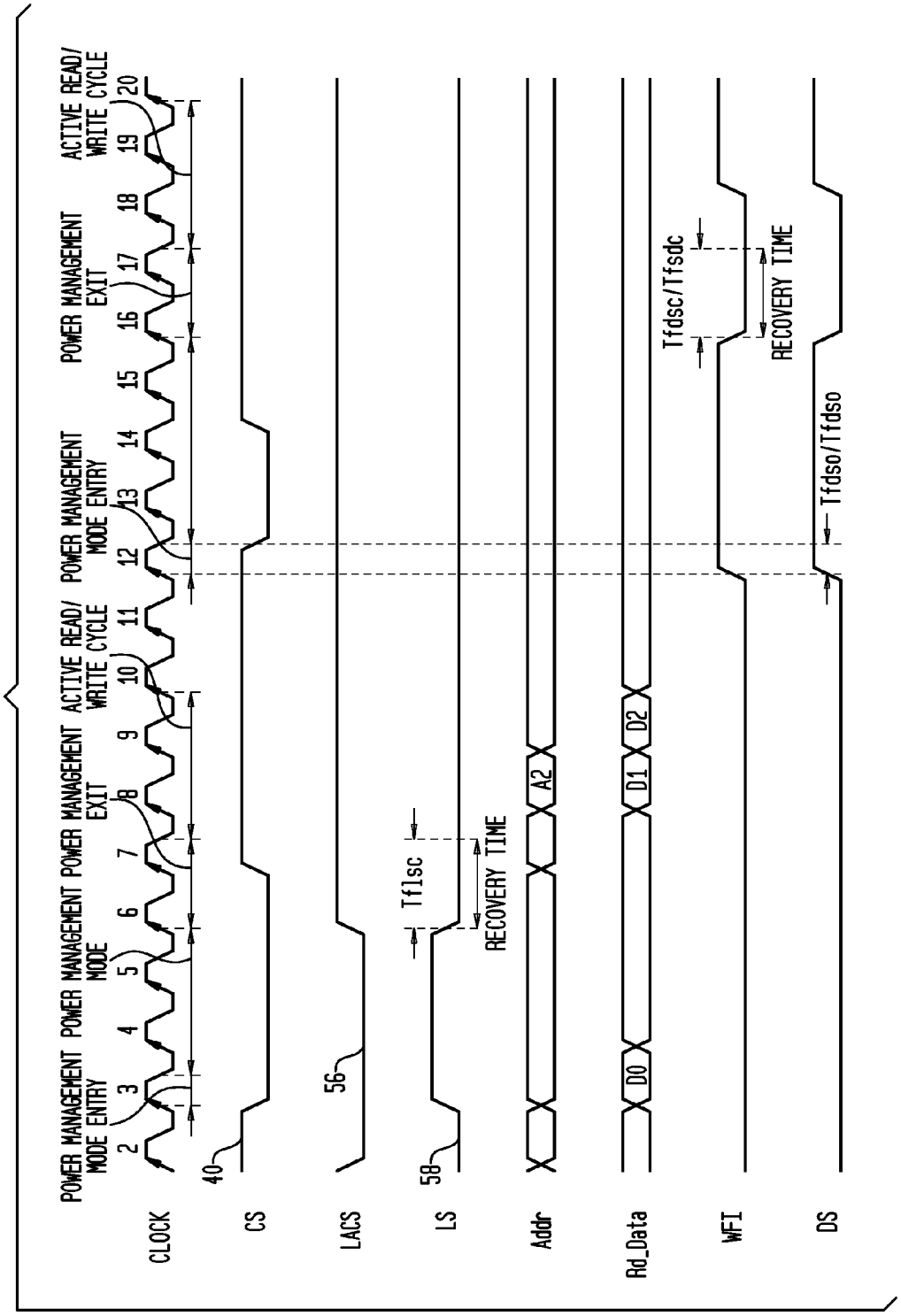
FIG. 15 is a timing diagram showing signal waveforms relevant to the circuit of FIG. 14 as a function of time.

FIG. 15 is a timing diagram showing illustrative signals generated in connection with the embodiment shown in FIG. 14 concerning mode 1. As apparent from the figure, the LS input signal is driven active as the CS input signal becomes inactive, and the LS input signal is driven inactive one clock cycle before the CS input signal becomes active.

Figure 16:
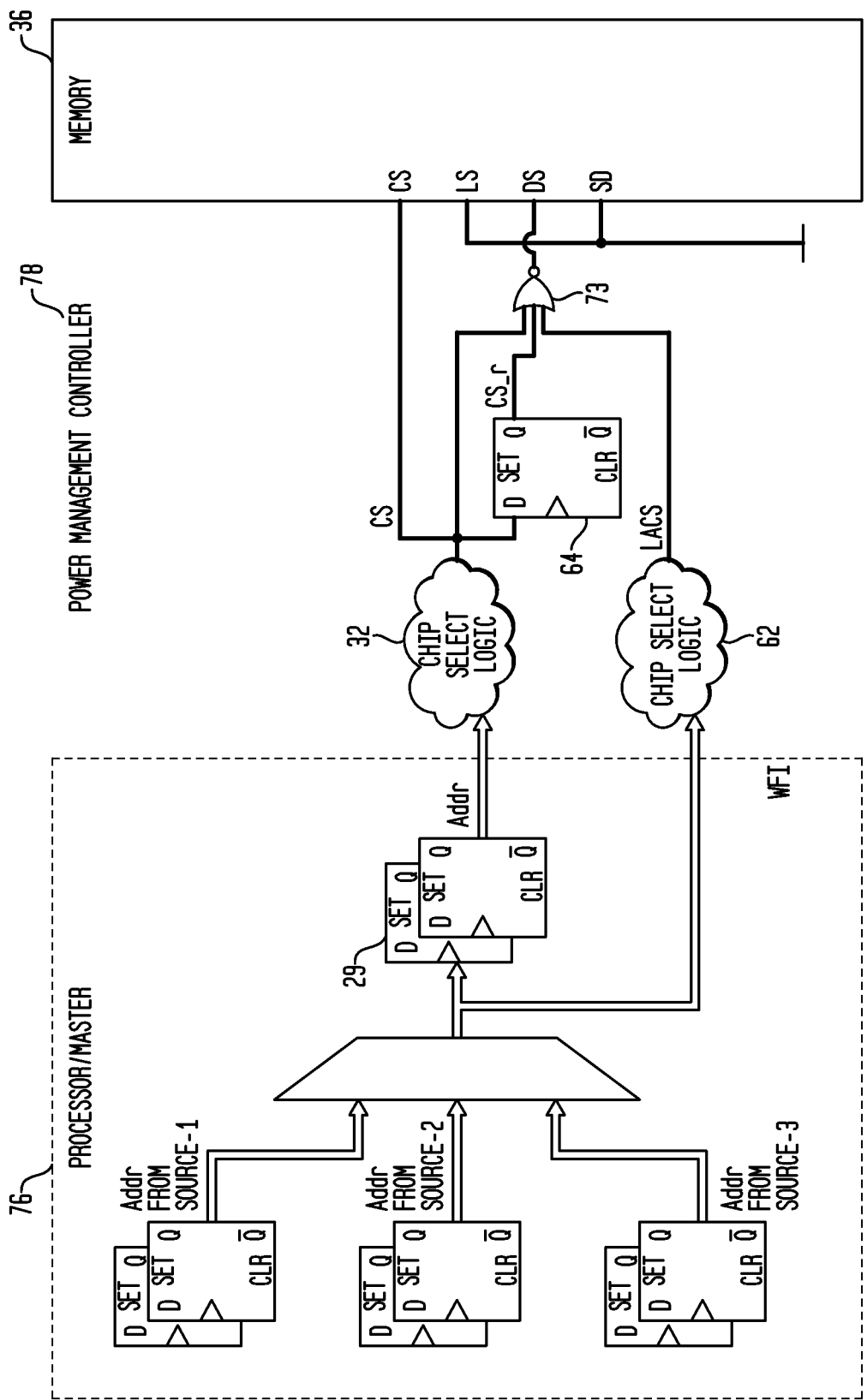
FIG. 16 is a block diagram of a circuit implementing mode 2 in accordance with the embodiments disclosed herein.

FIG. 16 shows a block diagram of an illustrative circuit implementation of mode 2, which includes the processor 76, power management controller 78, and memory device 36, as well as connection of the inverted look-ahead CS signal to the DS input of the memory device 36, according to an embodiment of the invention. The respective outputs of registers 29 are coupled to chip select logic 32, the output of which is coupled to the D input of register 64, the CS input of memory device 36, and a first input of NOR gate 73. The Q output of register 64 is coupled to a second input of NOR gate 73, the output of which is coupled to the DS input of memory device 36. The look-ahead version of the address signals (i.e., unclocked version of the address signals) output from the processor 76 are coupled to the look-ahead chip select logic 62, the output of which is coupled to a third input of NOR gate 73. The LS and SD inputs of the memory device 36 may be held inactive via coupling to ground, or an alternative voltage source. As a result, the memory device 36 will be in the deep sleep (DS) state whenever it is not being accessed. If the WFI output pin from the processor 76 is asserted, the inverted look-ahead CS signal will also be asserted.

Figure 17:
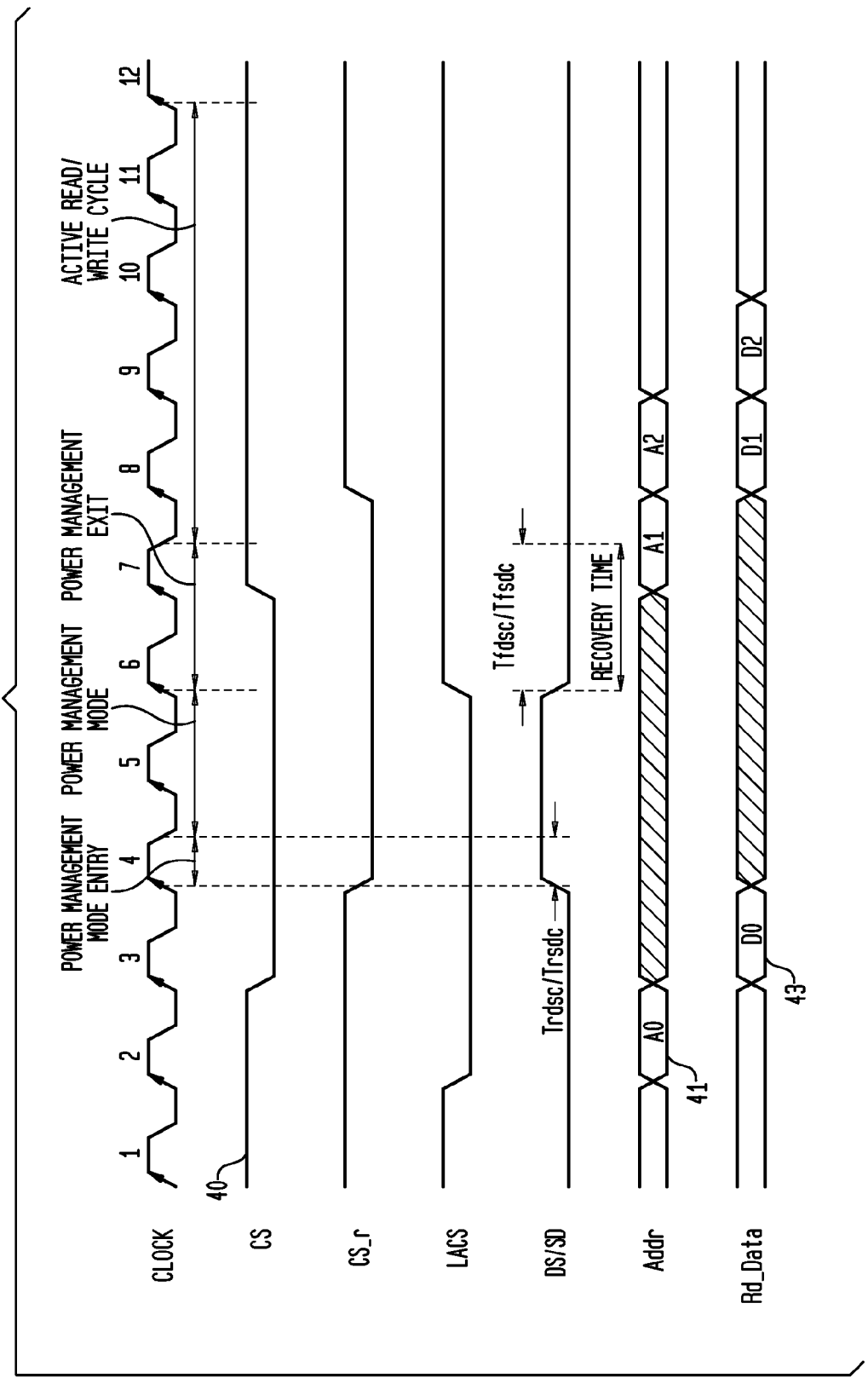
FIG. 17 is a timing diagram showing signal waveforms relevant to the circuit of FIG. 16 as a function of time.

FIG. 17 is a timing diagram showing illustrative signals generated in connection with the embodiment shown in FIG. 16 concerning mode 2. As apparent from FIG. 17, a longer recovery time during exit from the deep sleep mode is met due to the look-ahead implementation of the DS input to the memory device. The A0 address phase 41 is allowed to be completed before a D0 data phase 43. This occurs prior to entering the deep sleep mode by using the delay flip-flop or register 68 shown in FIG. 16 to generate a CS_r signal, upon which the DS input signal is based.

Figure 18:
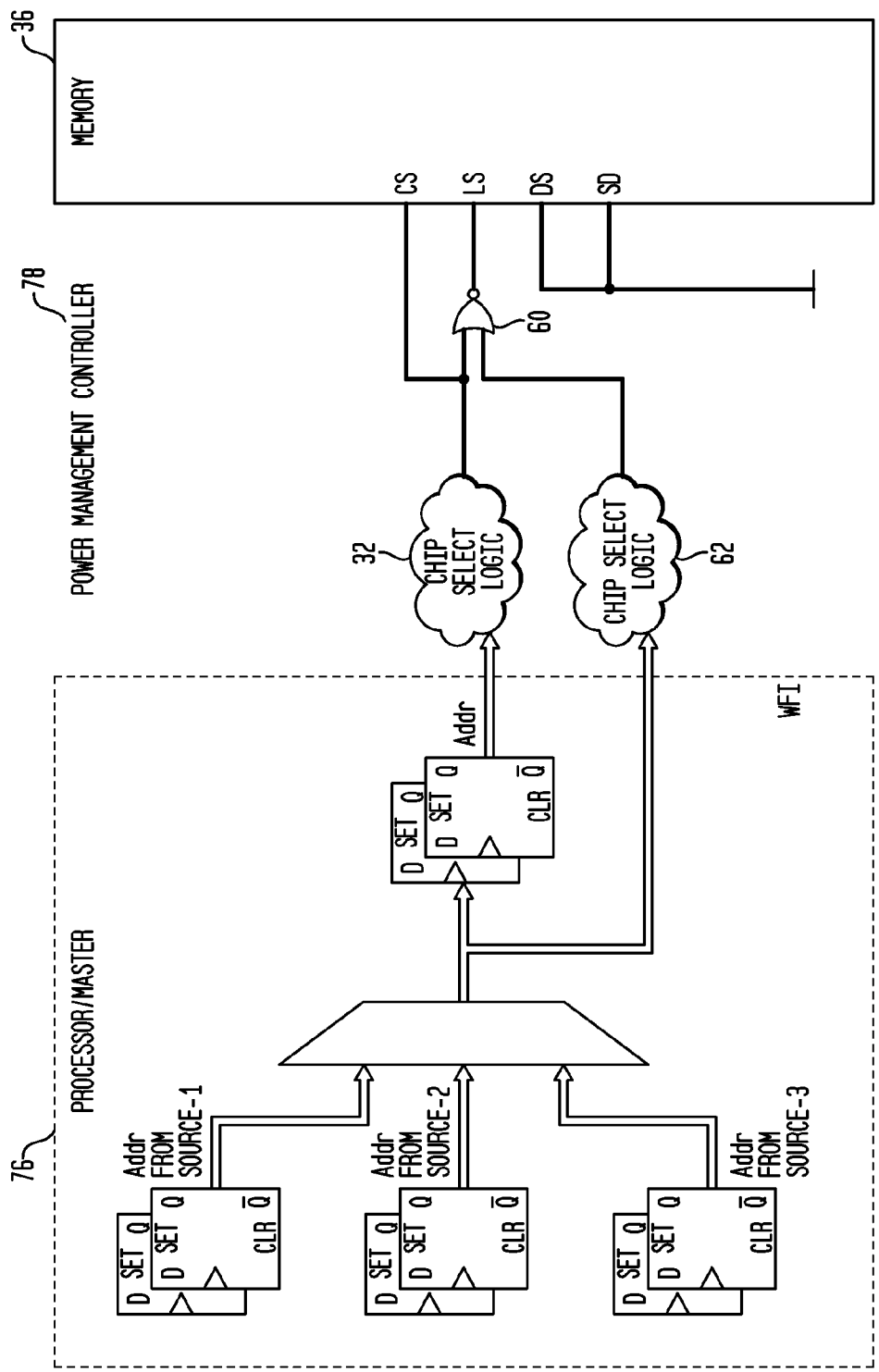
FIG. 18 is a block diagram of a circuit implementing mode 3 in accordance with the embodiments disclosed herein.

FIG. 18 shows a block diagram of an illustrative circuit implementation of mode 3 including connection of the inverted look-ahead chip select to the LS input of the memory device 36, according to an embodiment of the invention. In this embodiment, power management controller 78 includes chip select logic 32 adapted to receive the address signals from the processor 76 and look-ahead chip select logic 62 adapted to receive the look-ahead version of the address signals WFI (i.e., unclocked version of the address signals) output from the processor 76. The output of chip select logic 32 is coupled to the first input of NOR gate 60 and to the CS input of the memory device 36. The output of chip select logic 62 is coupled to the second input of NOR gate 60, the output of which is coupled to the LS input of memory device 36. As a result, the memory device will remain in light sleep (LS) mode whenever not being accessed. If the WFI output pin from processor 76 is asserted, the inverted look-ahead chip select signal will also be asserted. Both the DS and SD inputs of the memory device are held inactive via coupling, for example, to ground.

Figure 19:
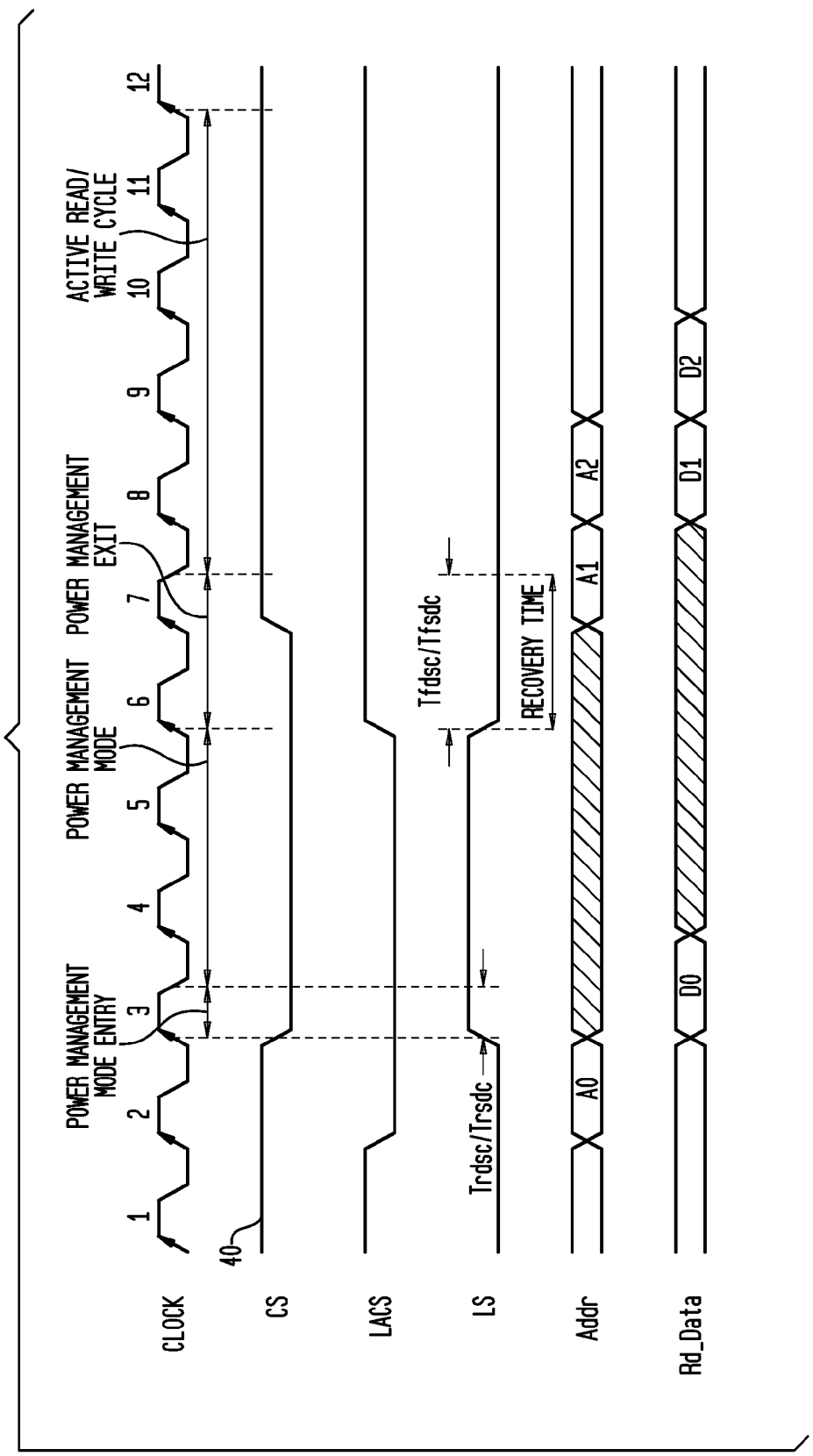
FIG. 19 is a timing diagram showing signal waveforms relevant to the circuit of FIG. 18 as a function of time.

FIG. 19 is a timing diagram showing exemplary signals generated in connection with the embodiment shown in FIG. 18 concerning mode 3. As shown in FIG. 19, a longer recovery time during exit from the deep sleep mode is met due to look-ahead implementation of the DS input signal. During the light sleep mode, the memory device holds the last data value at its data outputs, and thus additional delays, such as those upon entry into the deep sleep and shutdown modes, are not required. Completion of the data phase is automatic.

Figure 20:
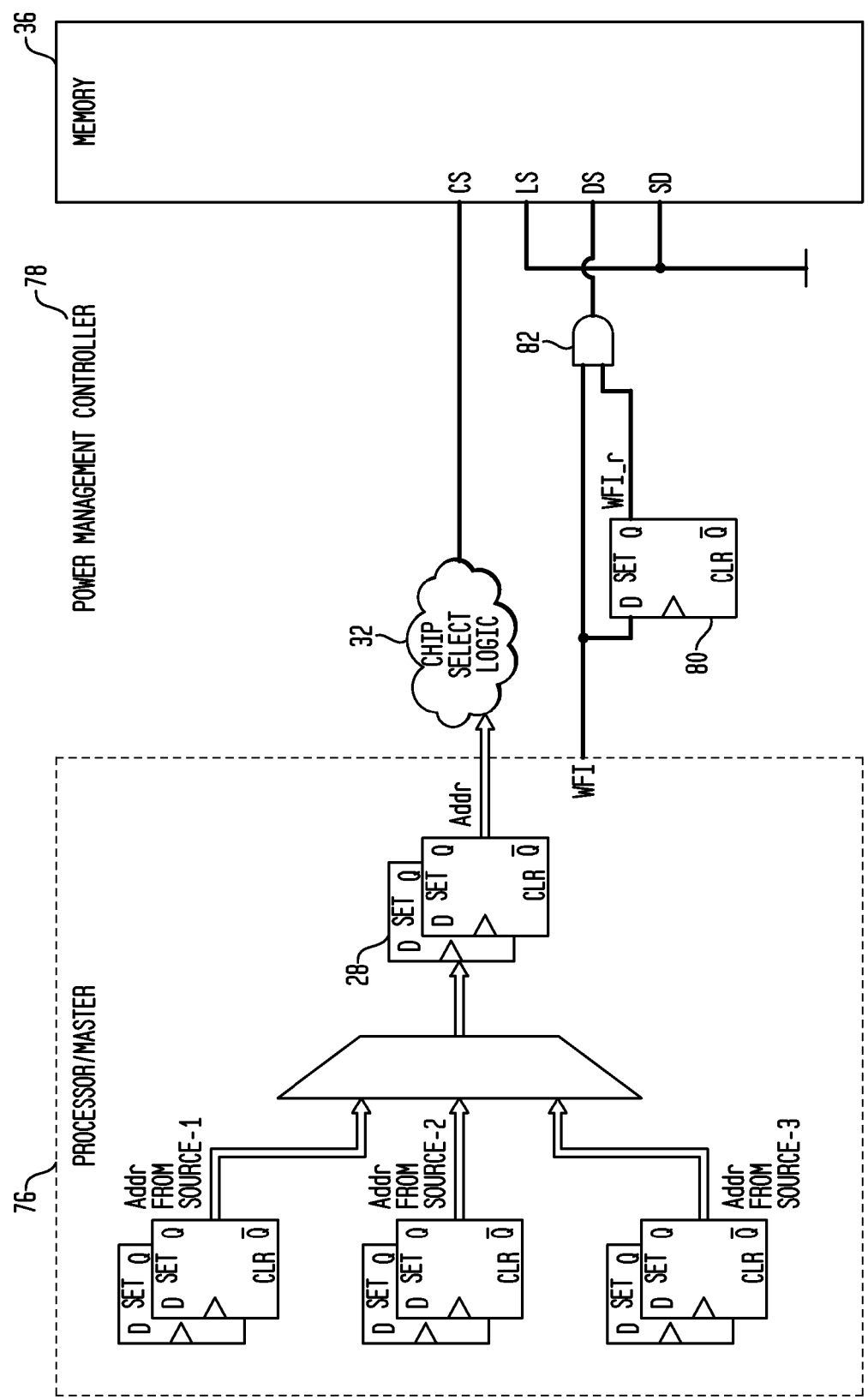
FIG. 20 is a block diagram of a circuit implementing mode 4 in accordance with the embodiments disclosed herein.

Regarding mode 4, FIG. 20 shows a block diagram of an exemplary circuit implementation, which includes the processor 76, power management controller 78, and memory device 36, according to an embodiment of the invention. With reference to FIG. 20, respective outputs of register 29 are coupled to the chip select logic 32 in the power management controller 78, an output of which is coupled to the CS input of memory device 36. The WFI output of the processor 76 is coupled to a first input of an OR gate 82 in power management controller 78 and to the D input of register 80 (shown as a D flip-flop), the Q output of which is coupled to a second input of OR gate 82. An output of OR gate 82 is coupled to the DS input of memory device 36.

Figure 21:
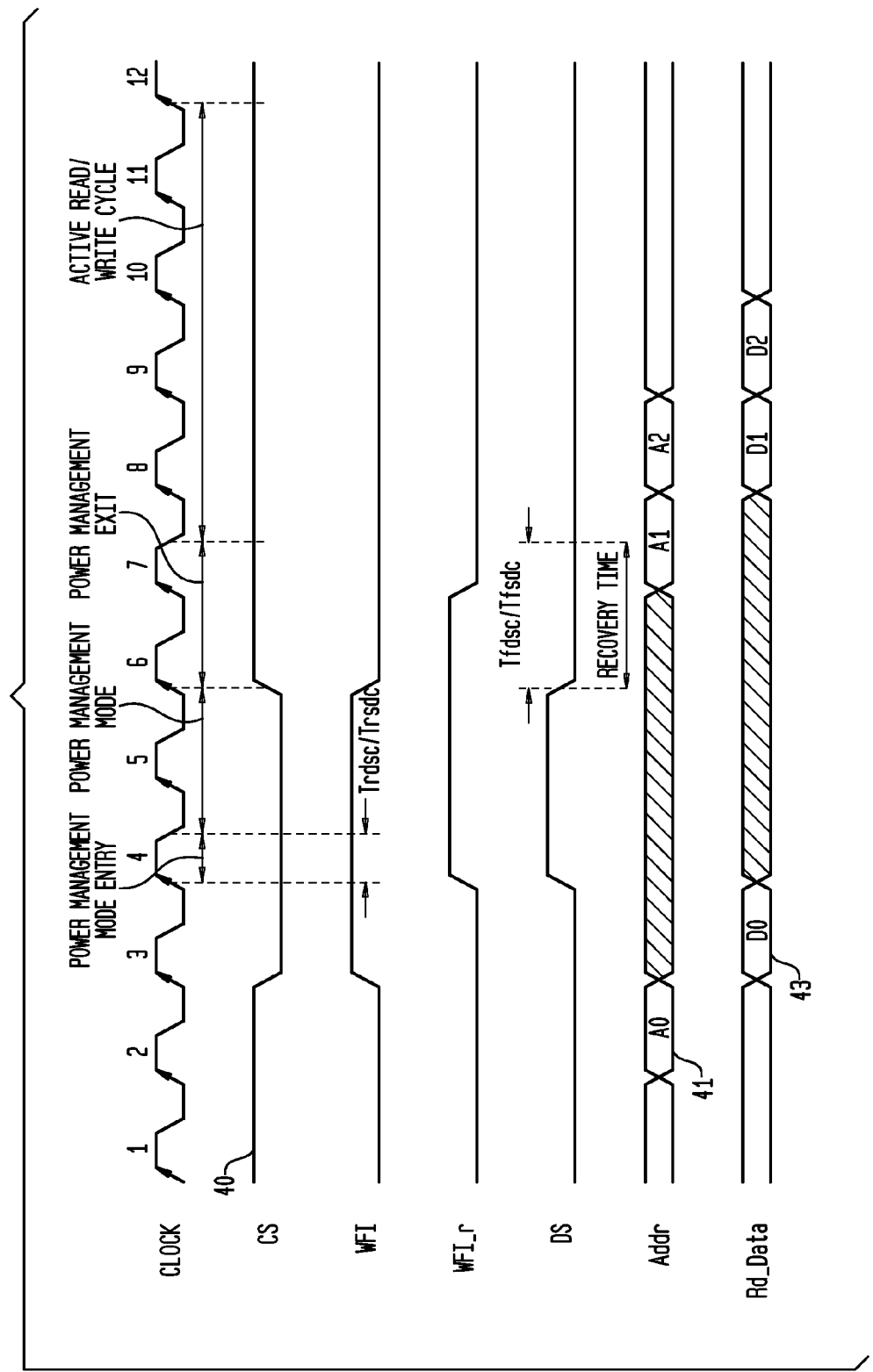
FIG. 21 is a timing diagram showing signal waveforms relevant to the circuit of FIG. 20 as a function of time.

FIG. 21 is a timing diagram showing exemplary signals generated in connection with the embodiment shown in FIG. 20 concerning mode 4. With reference to FIG. 21, a longer recovery time during exit from the deep sleep mode is met due to the look-ahead implementation of the DS input of the memory device 36. The A0 address phase 41 is completed before entering the D0 data phase 43. This occurs prior to entering the deep sleep mode by using a delay element, register, or flip-flop 80 shown in FIG. 20, which is used to generate the CS_r signal, upon which the DS input signal is based.

Figure 22:
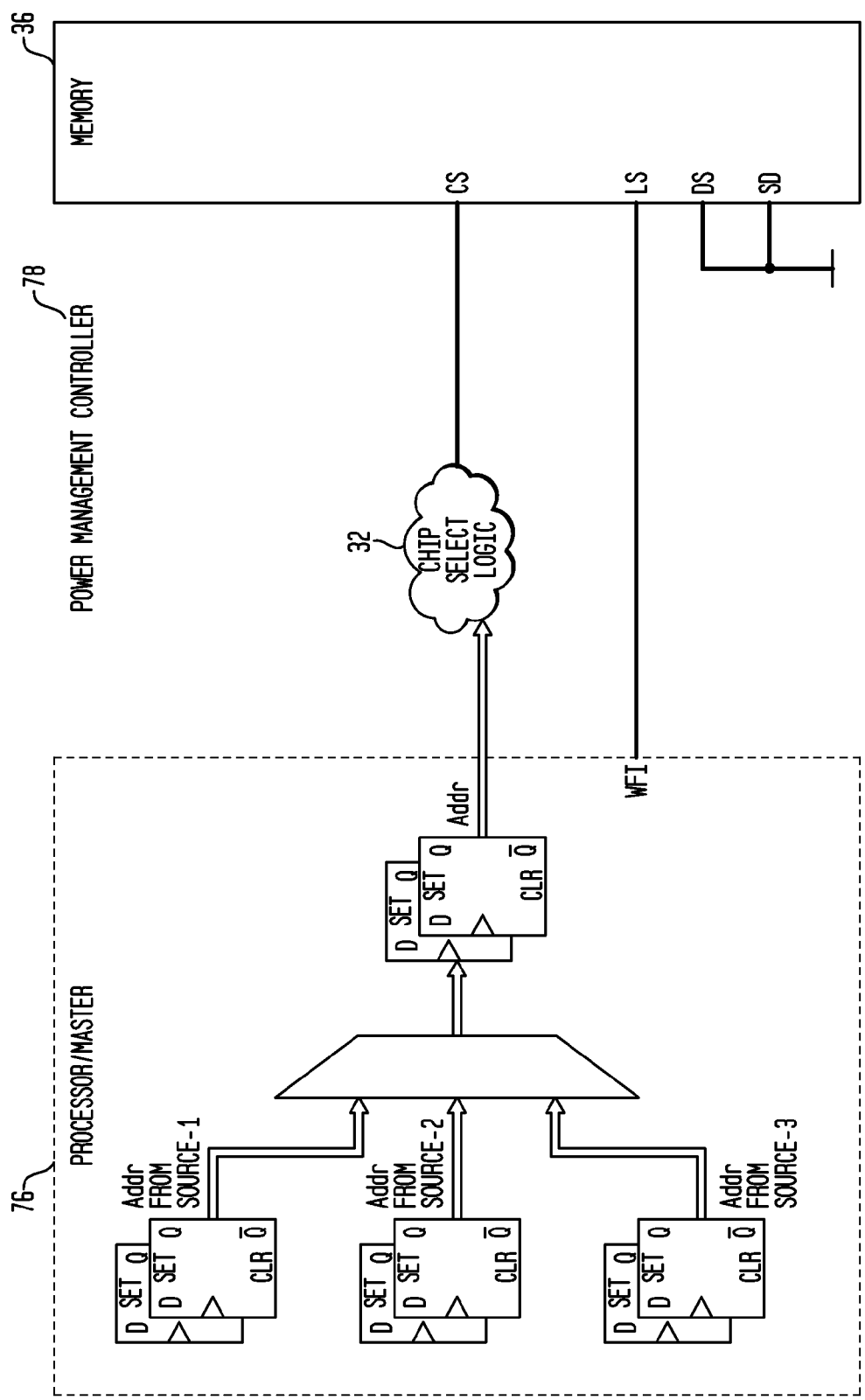
FIG. 22 is a block diagram of a circuit implementing mode 5 in accordance with the embodiments disclosed herein.

Regarding mode 5, if mode 4 is inappropriate, then the WFI output of the processor may be coupled to the LS input of the memory device. FIG. 22 shows a block diagram of an exemplary circuit implementation of mode 5, including connection of the WFI output of processor 76 to the DS input of the memory device 36, according to an embodiment of the invention. The LS fall setup time or recovery time should be satisfied in order for mode 5 to be appropriate. Mode 5 results in the least amount of power being saved as compared with modes 1-4. Mode 4 is similar to mode 5, except that in mode 4 the WFI output is connected to the DS input of the memory device 36, whereas in mode 5 the WFI output is connected to the LS input of the memory device, as depicted in FIG. 22. The DS and SD inputs of memory device 36 are held inactive (e.g., connected to ground).

Figure 23:
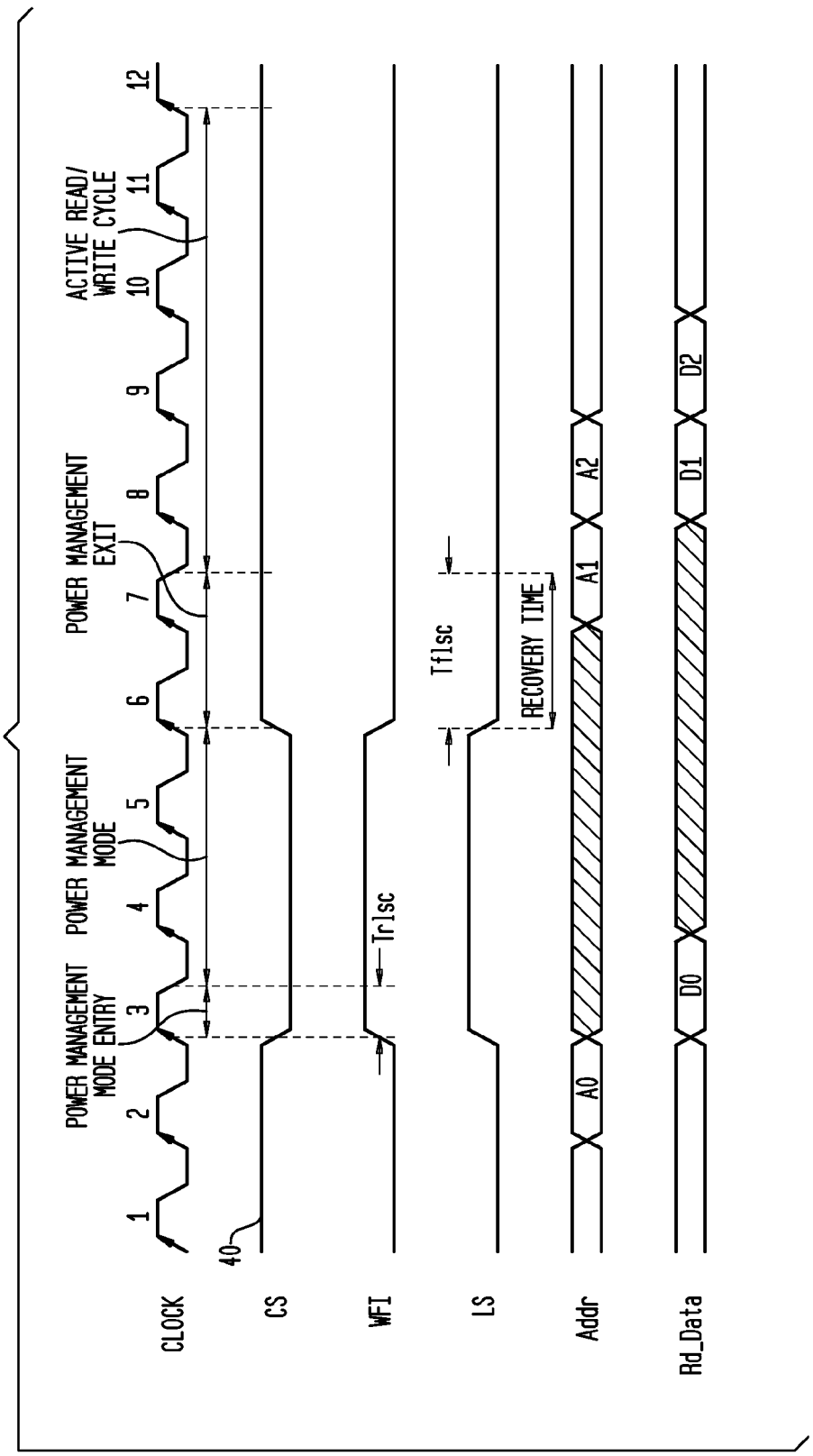
FIG. 23 is a timing diagram showing signal waveforms relevant to the circuit of FIG. 22 as a function of time.

FIG. 23 is a timing diagram depicting exemplary signals generated in connection with the embodiment shown in FIG. 22 concerning mode 5. During the light sleep mode, the memory device holds the last data value at its data outputs, and thus additional delays, such as those upon entry into the deep sleep and shutdown modes, are not required. Completion of the data phase is automatic.

A truth table for the modes described above that illustrates the respective connections to the power-saving input pins of the memory device is shown in Table 4 below. As will become apparent to those skilled in the art, three mode select control signals, m0, m1 and m2, are used to encode the five power-saving modes described herein. Since eight distinct states are provided using three control signals (i.e., $2^3$), and since only five states are used, three states will be left unused, as indicated by the designation "NA" in Table 4.

TABLE 4

| Description | Mode | | | ~CS to DS | WFI to DS | ~CS to LS | WFI to LS |
| --- | --- | --- | --- | --- | --- | --- | --- |
| | m2 | m1 | m0 | | | | |
| NA | 0 | 0 | 0 | 0 | 0 | 0 | 0 |
| Mode-1 | 0 | 1 | 0 | 0 | 1 | 1 | 0 |
| Mode-2 | 0 | 0 | 1 | 1 | 0 | 0 | 0 |
| Mode-3 | 0 | 1 | 1 | 0 | 0 | 1 | 0 |
| Mode-4 | 1 | 0 | 0 | 0 | 1 | 0 | 0 |
| Mode-5 | 1 | 0 | 1 | 0 | 0 | 0 | 1 |
| NA | 1 | 1 | 0 | 0 | 0 | 0 | 0 |
| NA | 1 | 1 | 1 | 0 | 0 | 0 | 0 |

The following Boolean equations, which are derived from the truth table shown in Table 4, may be used to design a power management controller in accordance with an embodiment of the invention:

$$\text{WFI to LS} = m2 \cdot {\sim}m1 \cdot m0; \quad (1)$$

$$\sim\text{CS to LS} = {\sim}m2 \cdot m0; \quad (2)$$

$$\sim\text{CS to DS} = {\sim}m2 \cdot m1 \cdot {\sim}m0; \text{ and} \quad (3)$$

$$\text{WFI to DS} = {\sim}m2 \cdot {\sim}m1 \cdot m0 + m2 \cdot {\sim}m1 \cdot {\sim}m0 \cdot \quad (4)$$

Figure 24:
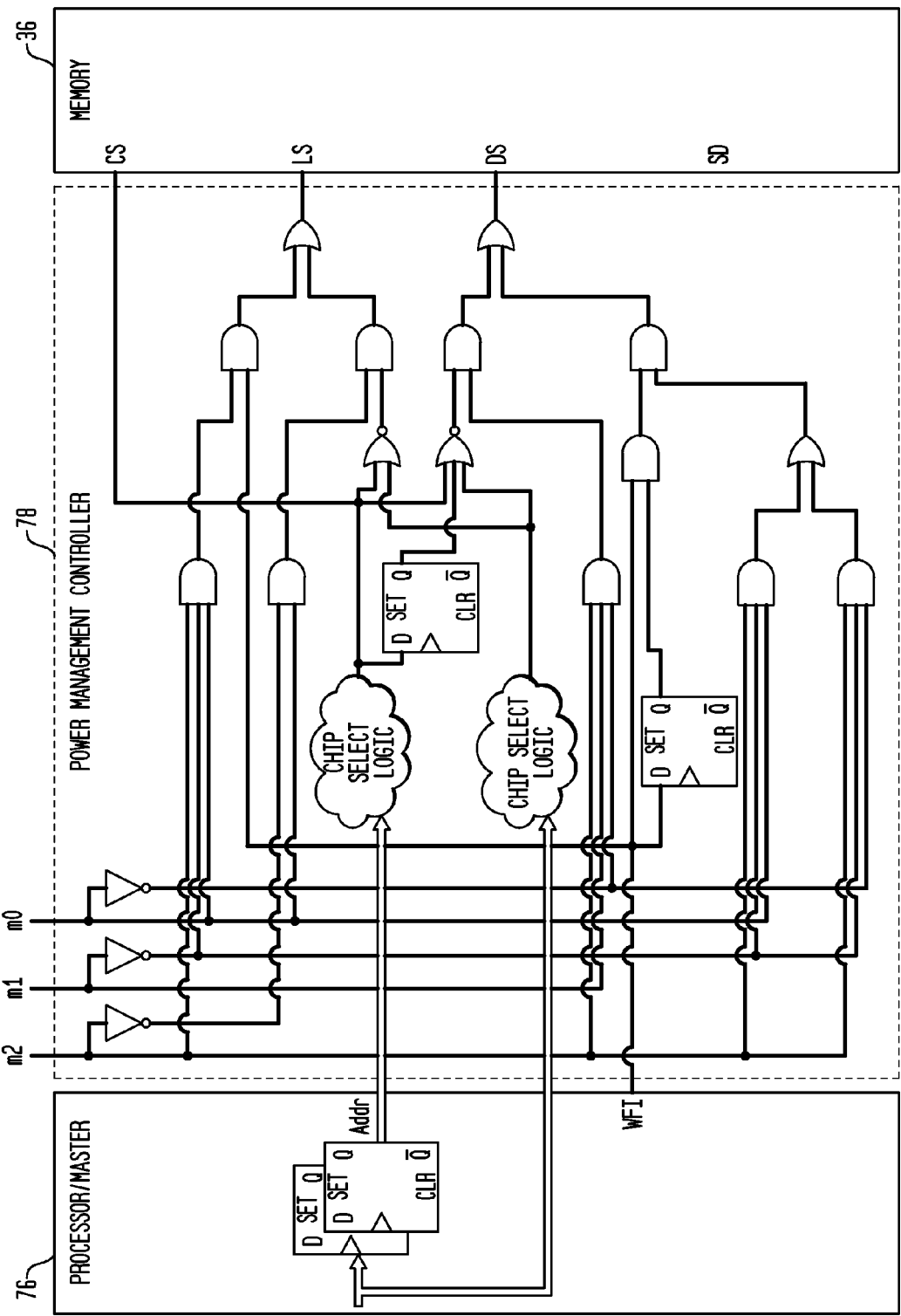
FIG. 24 is a schematic diagram of a circuit implementing modes 1-5 in accordance with the embodiments disclosed herein.

An illustrative digital hardware circuit suitable for implementing the truth table shown in Table 4 is depicted in FIG. 24, according to an embodiment of the invention. It is to be understood, however, that this circuit is shown by way of example only, and that alternative circuits for implementing techniques of the invention are similarly contemplated, as will become apparent to those skilled in the art given the teachings herein.

With reference to FIG. 24, it is anticipated that an external control signal (not explicitly shown in FIG. 24), which can bypass the power management controller 78 to force the memory device 36 into the light sleep, deep sleep, or shutdown modes may be provided while remaining within the scope of the present disclosure. It is also anticipated that when the processor 76 is inactive and can operate at a lower system clock frequency, the LS and/or DS setup times can more readily be satisfied.

Figure 25:
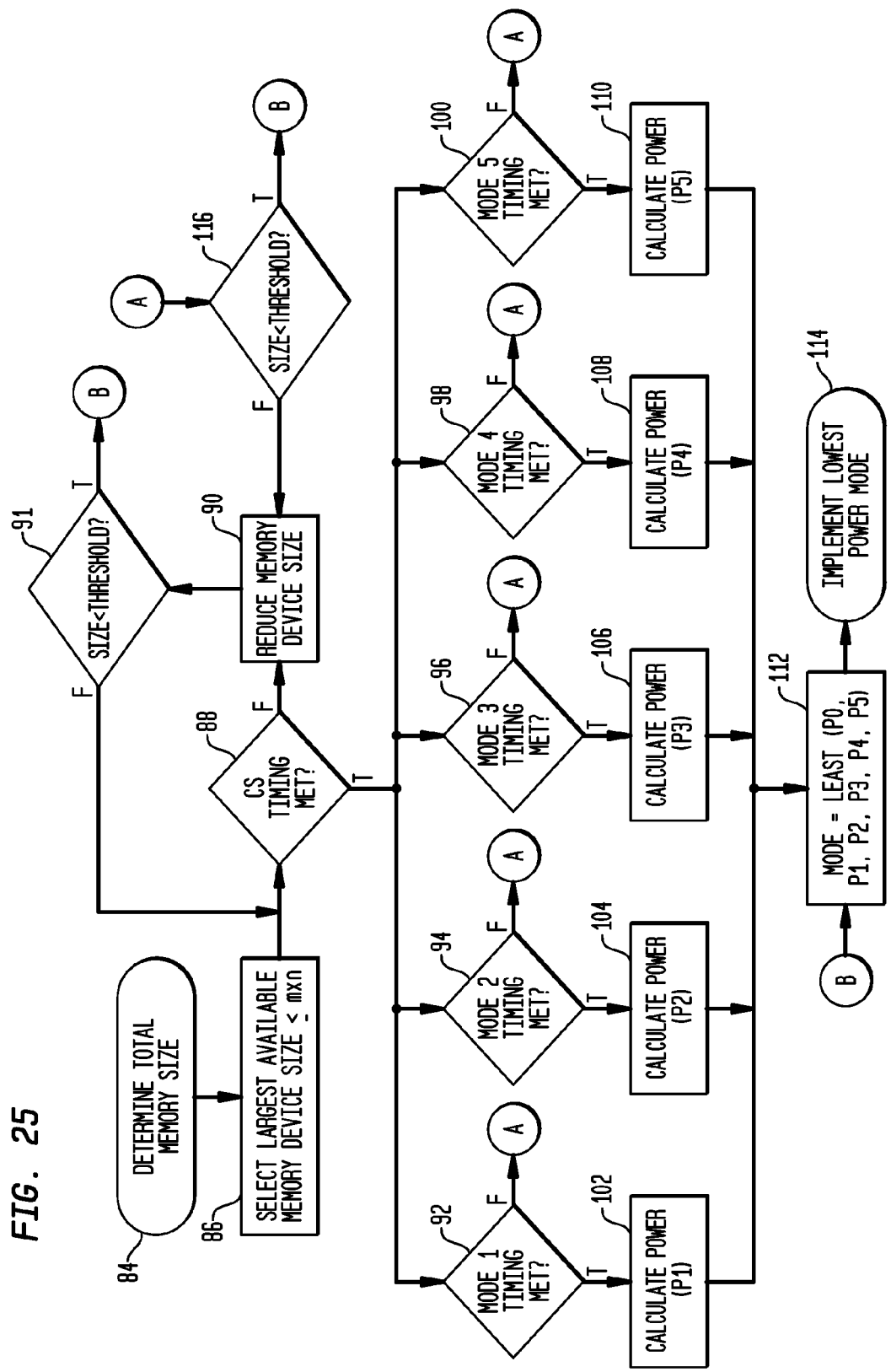
FIG. 25 is a flowchart of a method of selecting an optimal power saving mode in accordance with the embodiments disclosed herein.

A goal of power mode management is to select the mode that maximizes overall power savings. FIG. 25 is a flowchart showing an exemplary process of selecting the appropriate power mode, according to an embodiment of the invention. A basic assumption involved in this mode selection methodology is that, for a given total memory size, larger divisions of memory consume less power as compared with smaller divisions of memory. For example, for 32 KB of total memory, two (2) banks of 16 KB memory devices consume less power than four (4) banks of 8 KB memory devices. Thus, the largest possible memory device is preferably selected initially. Thereafter, smaller memory devices may be substituted for larger devices in order to meet timing constraints. The feasibility of using a particular size of memory device is preferably analyzed with respect to each of the five (5) power-saving modes discussed above since each of the modes may have different timing requirements. If a particular memory device size is found to meet the timing requirements imposed by a power-saving mode, the power consumed by the particular memory device is computed.

For example, if the timing requirements for the LS input of the memory device when driven by the inverted look-ahead CS output of the processor using 16 KB memory devices is satisfied, then the corresponding power is calculated for this memory device or split configuration. Once power consumption is calculated for a particular power mode in relation to a particular memory device, the power consumption for smaller memory devices need not be calculated since, although smaller memory devices will also satisfy the timing requirements, smaller devices will also consume more power. The method shown in FIG. 25 is repeated iteratively until power calculations for each of the power modes have been performed. As a result, an optimum memory device or split configuration is generated for each power mode in an iterative manner. It is anticipated that the same memory device size may be optimal for more than one power mode. Likewise, the same power mode may be optimal for more than one memory size/split configuration.

With reference now to FIG. 25, the method begins in step 84 by determining the appropriate total memory size m×n, where m represents a length or quantity of memory locations, such as 32 kB, and n represents a width or number of bits in a word of the memory. The largest memory device size is then selected that is less than or equal to the total memory size m×n in step 86, and the corresponding chip select timing is analyzed in step 88. If the chip select timing cannot be satisfied, then the memory device size is reduced in step 90 and if the reduced size is checked against a minimum threshold in step 91. If the reduced size is not less than the minimum threshold, the chip select timing is analyzed for the reduced memory size in step 88. If the reduced size is less than the minimum threshold in step 91, the process proceeds to step 112. If the chip select timing can be satisfied in step 88, the timing corresponding to each of modes 1-5 is analyzed with respect to the selected memory device size in steps 92-100. If the mode timing in any of steps 92 through 100 can be satisfied, then the power corresponding to that mode and the selected memory device size is determined in the corresponding steps 102 through 110. The mode consuming the least power with respect to the selected memory device size is then determined in step 112, and this mode is implemented in step 114. If any one or more of the mode timings, as analyzed in steps 92 through 100, is not satisfied, then the method determines whether the current memory device size is less than a minimum memory device size threshold in step 116. If so, the method proceeds to step 112, in which the lowest power mode is determined. However, if the current memory device size is not less than the minimum memory device size threshold in step 116, then the current memory device size is reduced in step 90 and the process is re-entered by determining whether the CS timing can be met with the reduced memory device size.

The decision block 116 provides a mechanism that limits iterations of the method, which may cause an infinite loop, to a selectable size of memory device granularity. Theoretically, the method may proceed to ever smaller memory divisions or memory device sizes down to, for example, 8×8 granularity. However, these iterations may be restricted to a pre-determined granularity, beyond which further splitting and timing feasibility verification concerning the various power modes will not be performed.

As previously stated, in step 112, the total memory power for each of the respective power modes are compared. The power mode providing the least power consumption is then implemented in step 114. The following timing equations are preferably used in steps 92 through 100 to verify whether timing for each of the corresponding modes is satisfied:

Mode 1: $T_{fdsc} < 4T$ and $T_{flsc} < T$;

Mode 2: $T_{fdsc} < T$;

Mode 3: $T_{flsc} < T$;

Mode 4: $T_{fdsc} < 4T$; and

Mode 5: $T_{flsc} < 4T$, where $T_{fdsc}$ represents the DS fall setup time, $T_{flsc}$ represents the LS fall setup time, and T represents the required system clock period.

By way of example only and without loss of generality, power savings corresponding to each of the different power-saving modes according to embodiments of the invention will now be discussed. A system clock frequency of 400 MHz, a CS input pin activity factor of 20%, a STANDBYWFI activity factor of 45%, and a STANDBYWFI toggling rate of 1 MHz are assumed. The power calculation is bifurcated into a leakage power calculation and a dynamic power calculation across power-saving modes 1-5.

Leakage power is significantly less for sleep modes as compared to the normal operational mode. To calculate the net leakage power, a weighted sum of the leakage power due to each mode is calculated. The weightings are proportional to the percentage of time the memory device is in each mode. For example, for a ~CS to LS connection, since the CS pin activity factor is 20%, LS will be asserted the remaining 80% of the time. Thus, the total leakage power will be 80% attributable to LS leakage and 20% attributable to normal leakage. Similarly, for a WFI to DS connection, since the DS asserted time is 45%, 45% of the total leakage power will be attributable to DS leakage and the remaining 55% of the total leakage power will be attributable to normal leakage. For cases in which both inverted look-ahead CS and WFI implementations are present, the total leakage power will be the weighted sum of the normal operation mode, light sleep mode, and deep sleep mode leakage powers. For example, if inverted look-ahead CS is connected to the LS input and WFI is connected to the DS input, 20% of the total leakage power will be attributable to normal mode leakage, 35% of the total leakage power will be attributable to light sleep mode leakage, and 45% of the total leakage power will be attributable to deep sleep mode leakage.

The dynamic power consumed in the power-saving modes is the product of the pin toggling rate and the pin dynamic power per megahertz. For example, for an inverted look-ahead CS to LS connection, the dynamic power consumed is the product of the LS toggling rate, which is 20% of 400 Mhz, and the LS dynamic power. Similarly, for a WFI to DS connection, the dynamic power consumed is the product of the DS toggling rate, which is 1 Mhz, and the DS dynamic power. In scenarios involving both inverted look-ahead CS and WFI implementations, the total dynamic power consumed will be the sum of the deep sleep mode and light sleep mode dynamic power components.

For memory devices without power saving features, the chip select (CS) input setup time, which is the amount of time that address and data inputs are required to be stable prior to CS becoming active, is critical. For memory with power saving features, CS may be tied active to make the chip select input setup time non-critical, so that whenever the memory device is not being accessed, the memory device can enter at least one of the power saving modes in response to the appropriate input on the power saving mode pins (LS, DS, and SD) being provided. That is, the chip select signal active is held active, and the power management controller is operative to transition the power mode control signal active in response to the memory device not being accessed.

The methods described above can be beneficially used to determine the total power in relation to the normal operation modes and each of the five power-saving modes referred to in Table 4. Table 5 shows results of the exemplary power calculation for a 4K×36 memory device configuration in the normal operational mode without any power-saving mode enabled.

TABLE 5

| Normal Mode | |
|---|---|
| Memory size | 4K × 36 |
| Leakage (μW) | 32303.7 |
| CLK Frequency (MHz) | 400 |
| CS Pin Power (μW/MHz) | 0.308 |
| CS Frequency (MHz) | 100 |
| CS Pin Power (μW) | 30.8 |
| Total Power (μW) | 32334.5 |

Exemplary power calculations for the same 4K×36 memory device in each of the five power-saving modes are shown in Tables 6 through 10 below, according to aspects of the invention.

TABLE 6

| Mode 1 | |
|---|---|
| Memory size | 4K × 36 |
| Leakage (μA) | 32630 |
| LS Leakage (μA) | 15500 |
| DS Leakage (μA) | 7391 |
| CLK Frequency (MHz) | 400 |
| CS Pin Power (μA/MHz) | 0.3112 |
| LS Pin Power (μA/MHz) | 10.81 |
| DS Pin Power (μA/MHz) | 70.67 |
| LS Frequency (MHz) | 80 |
| DS Frequency (MHz) | 1 |
| LS Cycles Asserted | 1.75 |
| DS Cycles Asserted | 180 |
| Leakage (μA) | 6526 |
| LS Leakage (μA) | 5425 |
| DS Leakage (μA) | 3326 |
| LS Pin Power (μA) | 864.8 |
| DS Pin Power (μA) | 71 |
| CS Pin Power (μA) | 25 |
| Total Power (μA) | 16237 |
| Savings (μA) | 16393 |
| Savings (%) | 50 |
| Number of Instances | 1 |
| Total Saving | 16393 |

TABLE 7

| Mode 2 | |
|---|---|
| Memory Size | 4K × 36 |
| Leakage (μA) | 32630 |
| DS Leakage (μA) | 7391 |
| CLK Frequency (MHz) | 400 |
| CS Pin Power (μA/MHz) | 0.3112 |
| DS Pin Power (μA/MHz) | 70.67 |
| DS Frequency (MHz) | 80 |
| DS Cycles Asserted | 4 |

TABLE 7-continued

| Mode 2 | |
|---|---|
| Memory Size | 4K × 36 |
| Leakage (μA) | 6526 |
| DS Leakage (μA) | 5913 |
| DS Pin Power (μA) | 5654 |
| CS Pin Power (μA) | 25 |
| Total Power (μA) | 18117 |
| Savings (μA) | 14513 |
| Savings (%) | 44 |
| Number of Instances | 1 |
| Total Saving | 14513 |

TABLE 8

| Mode 3 | |
|---|---|
| Memory Size | 4K × 36 |
| Leakage (μA) | 32630 |
| LS Leakage (μA) | 15500 |
| CLK Frequency (MHz) | 400 |
| CS Pin Power (μA/MHz) | 0.3112 |
| LS Pin Power (μA/MHz) | 10.81 |
| LS Frequency (MHz) | 80 |
| LS Cycles Asserted | 4 |
| Leakage (μA) | 6526 |
| DS Leakage (μA) | 12400 |
| DS Pin Power (μA) | 865 |
| CS Pin Power (μA) | 25 |
| Total Power (μA) | 19816 |
| Savings (μA) | 12814 |
| Savings (%) | 39 |
| Number of Instances | 1 |
| Total Saving | 12814 |

TABLE 9

| Mode 4 | |
|---|---|
| Memory Size | 4K × 36 |
| Leakage (μA) | 32630 |
| DS Leakage (μA) | 7391 |
| CLK Frequency (MHz) | 400 |
| CS Pin Power (μA/MHz) | 0.3112 |
| DS Pin Power (μA/MHz) | 70.67 |
| DS Frequency (MHz) | 1 |
| DS Cycles Asserted | 180 |
| Leakage (μA) | 17947 |
| DS Leakage (μA) | 3326 |
| DS Pin Power (μA) | 71 |
| CS Pin Power (μA) | 0.3112 |
| Total Power (μA) | 21343 |
| Savings (μA) | 11287 |
| Savings (%) | 35 |
| Number of Instances | 1 |
| Total Saving(μA) | 11287 |

TABLE 10

| Mode 5 | |
|---|---|
| Memory size | 4K × 36 |
| Leakage (μA) | 32630 |
| LS Leakage (μA) | 15500 |
| CLK Frequency (MHz) | 400 |
| CS Pin Power (μA/MHz) | 0.3112 |
| LS Pin Power (μA/MHz) | 10.81 |
| LS Frequency (MHz) | 1 |
| LS Cycles Asserted | 180 |

TABLE 10-continued

Mode 5

| Memory size | 4K × 36 |
|---|---|
| Leakage (µA) | 17947 |
| LS Leakage (µA) | 6975 |
| LS Pin Power (µA) | 11 |
| Total Power (µA) | 24932 |
| Savings (µA) | 7698 |
| Savings (%) | 24 |
| Number of Instances | 1 |
| Total Saving | 7698 |

Figure 26:
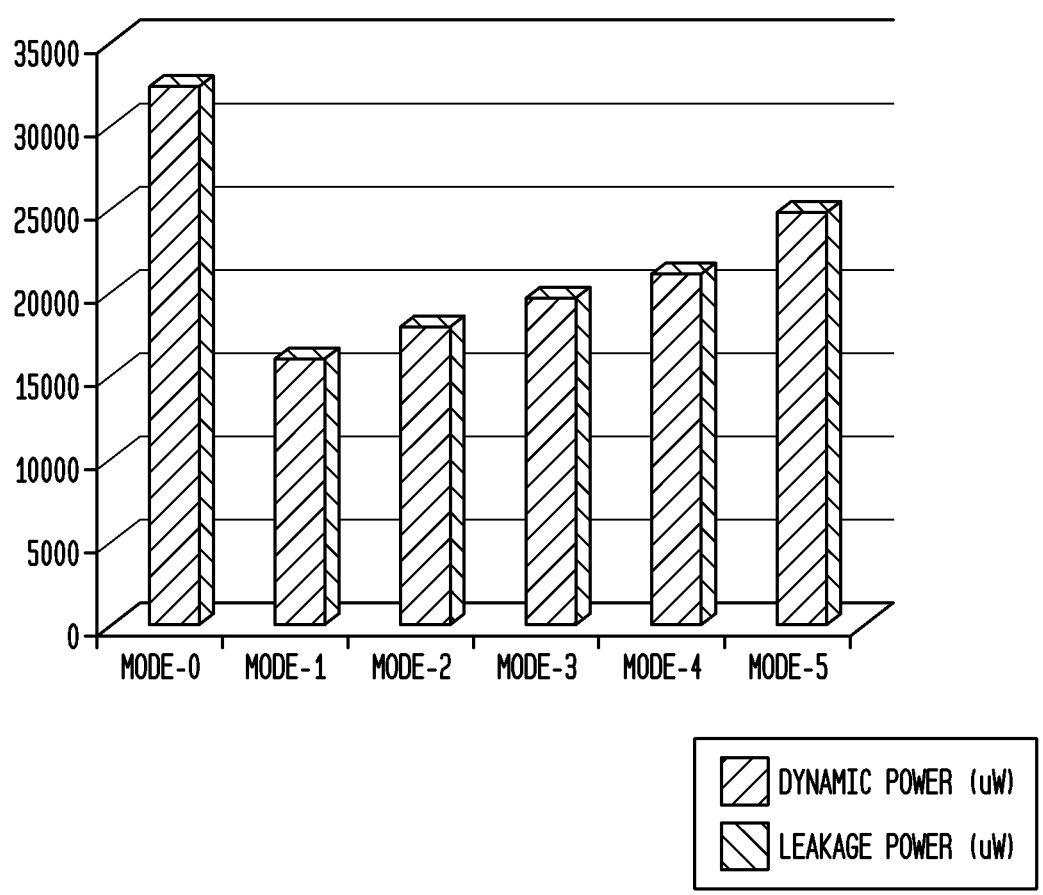
FIG. 26 is a histogram showing power consumption in the normal operational mode (mode 0) and modes 1-5.

A comparison between power consumption in the power-saving modes and in the normal mode (mode 0) is shown in Table 11 below, and a histogram of these results is shown in FIG. 26.

TABLE 11

| Mode | Leakage Power (µW) | Dynamic Power (µW) | Total Power (µW) |
|---|---|---|---|
| 0 (Normal Mode) | 32304 | 31 | 32335 |
| 1 | 6526 | 9711 | 16237 |
| 2 | 6526 | 11591 | 18117 |
| 3 | 6526 | 13290 | 19816 |
| 4 | 17647 | 3696 | 21343 |
| 5 | 17947 | 6985 | 24932 |

Figure 27:
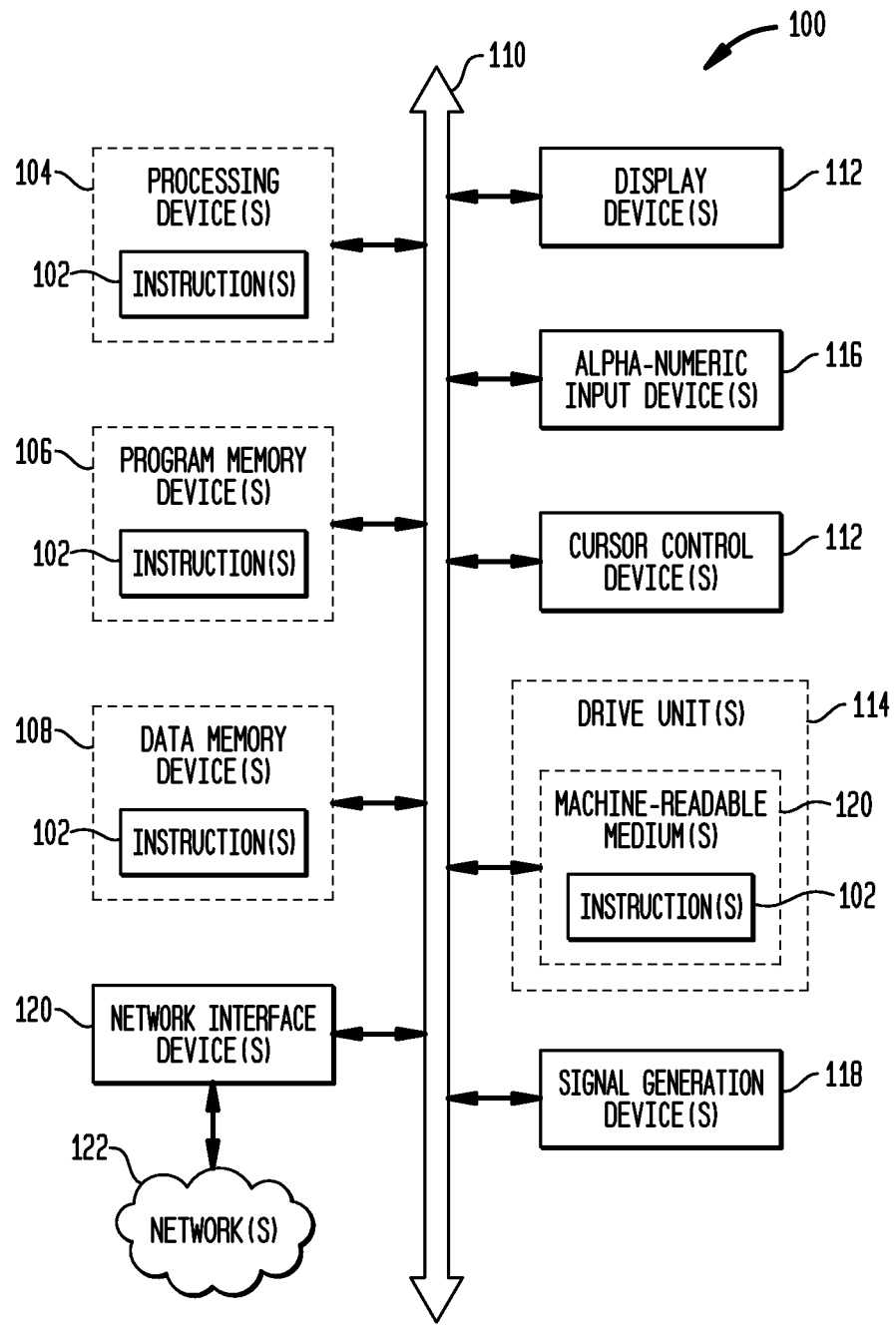
FIG. 27 is a block diagram of an exemplary machine in the form of a computing system which includes a set of instructions that, when executed, may cause the machine to perform one or more methodologies according to the embodiments disclosed herein.

FIG. 27 is a block diagram of an embodiment of a machine in the form of a computing system 100, within which a set of instructions 102, that when executed, may cause the machine to perform any one or more of the methodologies disclosed herein. In some embodiments, the machine operates as a standalone device. In some embodiments, the machine may be connected (e.g., using a network) to other machines. In a networked implementation, the machine may operate in the capacity of a server or a client user machine in a server-client user network environment. The machine may comprise a server computer, a client user computer, a personal computer (PC), a tablet PC, a Personal Digital Assistant (PDA), a cellular telephone, a mobile device, a palmtop computer, a laptop computer, a desktop computer, a communication device, a personal trusted device, a web appliance, a network router, a switch or bridge, or any machine capable of executing a set of instructions (sequential or otherwise) that specify actions to be taken by that machine.

The computing system 100 may include a processing device(s) 104 (e.g., a central processing unit (CPU), a graphics processing unit (GPU), or both), program memory device(s) 106, and data memory device(s) 108, which communicate with each other via a bus 110. The computing system 100 may further include display device(s) 112 (e.g., liquid crystals display (LCD), a flat panel, a solid state display, or a cathode ray tube (CRT)). The computing system 100 may include input device(s) 116 (e.g., a keyboard), cursor control device(s) 112 (e.g., a mouse), disk drive unit(s) 114, signal generation device(s) 118 (e.g., a speaker or remote control), and network interface device(s) 120.

The disk drive unit(s) 114 may include machine-readable medium(s) 120, on which is stored one or more sets of instructions 102 (e.g., software) embodying any one or more of the methodologies or functions disclosed herein, including those methods illustrated herein. The instructions 102 may also reside, completely or at least partially, within the program memory device(s) 106, the data memory device(s) 108, and/or within the processing device(s) 104 during execution thereof by the computing system 100. The program memory device(s) 106 and the processing device(s) 88 may also constitute machine-readable media. Dedicated hardware implementations 104, such as but not limited to application specific integrated circuits, programmable logic arrays, and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments, the methods, functions or logic described herein may be implemented as one or more software programs running on a computer processor. Dedicated hardware implementations including, but not limited to, application specific integrated circuits, programmable logic arrays and other hardware devices can likewise be constructed to implement the methods described herein. Furthermore, alternative software implementations including, but not limited to, distributed processing or component/object distributed processing, parallel processing, or virtual machine processing can also be constructed to implement the methods, functions or logic described herein.

The present embodiment contemplates a machine-readable medium or computer-readable medium containing instructions 102, or that which receives and executes instructions 102 from a propagated signal so that a device connected to a network environment 122 can send or receive voice, video or data, and to communicate over the network 122 using the instructions 102. The instructions 102 may further be transmitted or received over a network 122 via the network interface device(s) 120. The machine-readable medium may also contain a data structure for storing data useful in providing a functional relationship between the data and a machine or computer in an illustrative embodiment of the disclosed systems and methods.

While the machine-readable medium 102 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding, or carrying a set of instructions for execution by the machine and that cause the machine to perform anyone or more of the methodologies of the present embodiment. The term "machine-readable medium" shall accordingly be taken to include, but not be limited to: solid-state memories such as a memory card or other package that houses one or more read-only (non-volatile) memories, random access memories, or other re-writable (volatile) memories; magneto-optical or optical medium such as a disk or tape; and/or a digital file attachment to e-mail or other self-contained information archive or set of archives is considered a distribution medium equivalent to a tangible storage medium. Accordingly, the embodiment is considered to include anyone or more of a tangible machine-readable medium or a tangible distribution medium, as listed herein and including art-recognized equivalents and successor media, in which the software implementations herein are stored.

It should also be noted that software which implements the disclosed methods, functions or logic may optionally be stored on a tangible storage medium, such as: a magnetic medium, such as a disk or tape; a magneto-optical or optical medium, such as a disk; or a solid state medium, such as a memory card or other package that houses one or more read-only (non-volatile) memories, random access memories, or other re-writable (volatile) memories. A digital file attachment to e-mail or other self-contained information archive or set of archives is considered a distribution medium equivalent to a tangible storage medium. Accordingly, the disclosure is considered to include a tangible storage medium or distribution medium as listed herein, and other equivalents and successor media, in which the software implementations herein may be stored.

Although the present specification describes components and functions implemented in the embodiments with reference to particular standards and protocols, the disclosed embodiment are not limited to such standards and protocols.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived there from, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Such embodiments of the inventive subject matter may be referred to herein, individually and/or collectively, by the term "embodiment" merely for convenience and without intending to voluntarily limit the scope of this application to any single embodiment or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate example embodiment.

The Abstract is provided to comply with 37 C.F.R. §1.72 (b), which requires an abstract that will allow the reader to quickly ascertain the nature of the technical disclosure. It is submitted with the understanding that it will not be used to interpret or limit the scope or meaning of the claims. In addition, in the foregoing Detailed Description of Preferred Embodiments, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description of Preferred Embodiments, with each claim standing on its own as separately claimed subject matter.

Although specific example embodiments have been described, it will be evident that various modifications and changes may be made to these embodiments without departing from the broader scope of the inventive subject matter described herein. Accordingly, the specification and drawings are to be regarded in an illustrative rather than a restrictive sense. The accompanying drawings that form a part hereof, show by way of illustration, and without limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description of Preferred Embodiments, therefore, is not to be taken in a limiting sense, and the scope of various embodiments is defined only by the appended claims, along with the full range of equivalents to which such claims are entitled.

Given the teachings of the invention provided herein, one of ordinary skill in the art will be able to contemplate other implementations and applications of the techniques of the invention. Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A power management controller configured to control a power mode associated with a memory device, the power management controller comprising at least one logic element operative to provide a power mode control signal, the at least one logic element being responsive to a first control signal and a second control signal, the second control signal being delayed from the first control signal by a prescribed amount of time, the first control signal being provided by a processing device, the power mode control signal transitioning (i) inactive before a chip select signal transitions active and (ii) active after the chip select signal transitions inactive, the chip select signal being operative to control the memory device, the power mode control signal being operative to control the power mode associated with the memory device.

2. The power management controller defined by claim 1, wherein the first control signal comprises at least one of an address signal and a wait for interrupt (WFI) signal.

3. The power management controller defined by claim 1, wherein the power management controller further comprises at least one delay element, the at least one delay element being operative to provide the second control signal, the at least one delay element being responsive to the first control signal.

4. The power management controller defined by claim 3, wherein the at least one delay element comprises at least one of a flip-flop, a register, and a latch.

5. The power management controller defined by claim 1, wherein the power management controller is configured to be operatively coupled between the processing device and the memory device.

6. The power management controller defined by claim 1, wherein the power mode associated with the memory device comprises at least one of a light sleep mode, a deep sleep mode, and a shutdown mode.

7. The power management controller defined by claim 1, wherein the at least one logic element is operative to provide the chip select signal, the at least one logic element being responsive to the first control signal.

8. The power management controller defined by claim 1, wherein the chip select signal is held active and the power management controller is operative to transition the power mode control signal active in response to the memory device not being accessed.

9. A method of controlling a power mode associated with a memory device, the method comprising:
  providing, by a power management controller, a power mode control signal, the power mode control signal being based on a control signal and a delayed control signal, the delayed control signal representing the control signal following a delay, the control signal being provided by a processing device; and
  transitioning the power mode control signal, by the power management controller, (i) inactive before a chip select signal transitions active and (ii) active after the chip select signal transitions inactive, the chip select signal being operative to control the memory device, the power mode control signal being operative to control the power mode associated with the memory device.

10. The method of controlling a power mode associated with a memory device defined by claim 9, wherein the control signal comprises at least one of an address signal and a wait for interrupt (WFI) signal.

11. The method of controlling a power mode associated with a memory device defined by claim 9, further comprising delaying the control signal to provide the delayed control signal.

12. The method of controlling a power mode associated with a memory device defined by claim 9, wherein the power mode associated with the memory device comprises at least one of a light sleep mode, a deep sleep mode, and a shutdown mode.

13. The method of controlling a power mode associated with a memory device defined by claim 9, further comprising providing the chip select signal based on the control signal.

14. The method of controlling a power mode associated with a memory device defined by claim 9, further comprising:
  holding the chip select signal active; and
  transitioning the power mode control signal active in response to the memory device not being accessed.

15. A method of selecting a power control mode associated with a power management controller, the power management controller being operative to control a power mode associated with a memory device, the method comprising:
  selecting, by a processing device, a largest memory device size that is less than or equal to a total memory size;
  determining, by the processing device, whether the memory device associated with the selected memory device size satisfies chip select signal timing requirements;
  determining, by the processing device, whether the memory device associated with the selected memory device size satisfies timing requirements associated with a plurality of power control modes in response to determining that the memory device associated with the selected memory device size satisfies the chip select signal timing requirements;
  calculating, by the processing device, power consumed by the memory device associated with the selected memory device size in the plurality of power control modes in response to determining that the memory device associated with the selected memory device size satisfies the timing requirements associated with the plurality of power control modes; and
  selecting, by the processing device, that power control mode in which the memory device associated with the selected memory device size consumes a least amount of power.

16. The method of selecting a power control mode associated with a power management controller defined by claim 15, the method further comprising:
  reducing the memory device size in response to determining that the memory device associated with the selected memory device size does not satisfy the chip select signal timing requirements;
  determining whether a memory device associated with the reduced memory device size satisfies chip select signal timing requirements;
  determining whether the memory device associated with the reduced memory device size satisfies timing requirements associated with the plurality of power control modes in response to determining that the memory device associated with the reduced memory device size satisfies the chip select signal timing requirements;
  calculating power consumed by the memory device associated with the reduced memory device size in the plurality of power control modes in response to determining that the memory device associated with the reduced memory device size satisfies the timing requirements associated with the plurality of power control modes; and
  selecting that power control mode in which the memory device associated with the reduced memory device size consumes a least amount of power.

17. The method of selecting a power control mode associated with a power management controller defined by claim 16, the method further comprising:
  determining whether the reduced memory device size is less than a threshold;
  calculating power consumed by the memory device associated with the reduced memory device size in the plurality of power control modes in response to determining that the memory device associated with the reduced memory device size satisfies the timing requirements associated with the plurality of power control modes; and
  selecting that power control mode in which the memory device associated with the reduced memory device size consumes a least amount of power.

18. The method of selecting a power control mode associated with a power management controller defined by claim 15, the power management controller being operative to control a power mode associated with a memory device, the method further comprising:
  reducing the memory device size in response to determining that the memory device associated with the selected memory device size does not satisfy a timing requirement associated with at least one of the plurality of power control modes;
  determining whether the memory device associated with the reduced memory device size satisfies chip select signal timing requirements;
  determining whether the memory device associated with the reduced memory device size satisfies timing requirements associated with the plurality of power control modes in response to determining that the memory device associated with the reduced memory device size satisfies the chip select signal timing requirements;

calculating power consumed by the memory device associated with the reduced memory device size in the plurality of power control modes in response to determining that the memory device associated with the reduced memory device size satisfies the timing requirements associated with the plurality of power control modes; and selecting that power control mode in which the memory device associated with the reduced memory device size consumes a least amount of power.

19. The method of selecting a power control mode associated with a power management controller defined by claim 18, the method further comprising:

determining whether the reduced memory device size is less than a threshold;

calculating power consumed by the memory device associated with the reduced memory device size in the plurality of power control modes in response to determining that the memory device associated with the reduced memory device size satisfies the timing requirements associated with the plurality of power control modes; and selecting that power control mode in which the memory device associated with the reduced memory device size consumes a least amount of power.

20. An electronic system comprising:
a processing device;
a memory device operatively coupled to the processing device; and
a power management controller operatively coupled to the processing device and memory device, the power management controller being configured to control a power mode associated with the memory device, the power management controller comprising at least one logic element operative to provide a power mode control signal, the at least one logic element being responsive to a control signal and a delayed control signal, the delayed control signal representing the control signal following a delay, the control signal being provided by the processing device, the power mode control signal transitioning (1) inactive before a chip select signal transitions active and (2) active after the chip select signal transitions inactive, the chip select signal being operative to control the memory device, the power mode control signal being operative to control the power mode associated with the memory device.

21. The power management controller defined by claim 20, wherein the control signal comprises at least one of an address signal and a wait for interrupt (WFI) signal.

22. The power management controller defined by claim 20, wherein the power management controller further comprises at least one delay element, the at least one delay element being operative to provide the delayed control signal, the at least one delay element being responsive to the control signal.

23. The power management controller defined by claim 20, wherein the power management controller is configured to be operatively coupled between the processing device and the memory device.

24. The power management controller defined by claim 20, wherein the power mode associated with the memory device comprises at least one of a light sleep mode, a deep sleep mode, and a shutdown mode.

25. The power management controller defined by claim 20, wherein the at least one logic element is operative to provide the chip select signal, the at least one logic element being responsive to the control signal.

\* \* \* \* \*